(12) United States Patent
Lin et al.

(10) Patent No.: US 12,406,721 B2
(45) Date of Patent: Sep. 2, 2025

(54) MEMORY CELL

(71) Applicant: Industrial Technology Research Institute, Hsinchu (TW)

(72) Inventors: Chih-Sheng Lin, Tainan (TW); Tuo-Hung Hou, Hsinchu (TW); Fu-Cheng Tsai, Tainan (TW); Jian-Wei Su, Hsinchu (TW); Kuo-Hua Tseng, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 385 days.

(21) Appl. No.: 17/983,331

(22) Filed: Nov. 8, 2022

(65) Prior Publication Data

US 2024/0079051 A1 Mar. 7, 2024

(30) Foreign Application Priority Data

Sep. 7, 2022 (TW) .................................. 111133890

(51) Int. Cl.
*G11C 11/41* (2006.01)
*G11C 11/412* (2006.01)
*G11C 11/418* (2006.01)

(52) U.S. Cl.
CPC .......... *G11C 11/412* (2013.01); *G11C 11/418* (2013.01)

(58) Field of Classification Search
CPC ... G11C 11/412; G11C 11/418; G11C 7/1006; G11C 8/08; G11C 11/54; G11C 11/419; G11C 11/417
See application file for complete search history.

(56) References Cited

U.S. PATENT DOCUMENTS 7,019,999 B1  3/2006  Srinivasan et al.
7,710,763 B2  5/2010  Houston
(Continued)

FOREIGN PATENT DOCUMENTS

CN  110277121  9/2019
CN  114999544  9/2022
(Continued)

OTHER PUBLICATIONS

Amir-Reza Ahmadimehr et al., "A High Speed Subthreshold SRAM Cell Design", 1st Int'l Symposium on Quality Electronic Design—Asia, Jul. 15-16, 2009, pp. 1-5.
(Continued)

*Primary Examiner* — Mohammed A Bashar
(74) *Attorney, Agent, or Firm* — JCIPRNET

(57) ABSTRACT

Disclosed is a memory cell including a first transistor having a first terminal coupled to a bit line; a second transistor having a first terminal coupled to a bit line bar; a weight storage circuit coupled between a gate terminal of the first transistor and a gate terminal of the second transistor, storing a weight value, and determining to turn on the first transistor or the second transistor according to the weight value; and a driving circuit coupled to a second terminal of the first transistor, a second terminal of the second transistor, and at least one word line, receiving at least one threshold voltage and at least one input data from the word line, and determining whether to generate an operation current on a path of the turned-on first transistor or the turned-on second transistor according to the threshold voltage and the input data.

20 Claims, 21 Drawing Sheets

(56) References Cited

U.S. PATENT DOCUMENTS

| | | | |
|---|---|---|---|
| 8,117,567 | B2 | 2/2012 | Arsovski |
| 8,125,810 | B2 | 2/2012 | Bosshart |
| 10,725,777 | B2 | 7/2020 | Shu et al. |
| 2015/0380064 | A1* | 12/2015 | McLaury .............. G11C 11/417 365/154 |
| 2021/0081775 | A1* | 3/2021 | Leobandung ........... G11C 11/54 |
| 2021/0397675 | A1 | 12/2021 | Lin et al. |
| 2022/0027723 | A1* | 1/2022 | Kolter ...................... G06N 3/08 |
| 2022/0076737 | A1 | 3/2022 | Cosemans et al. |

FOREIGN PATENT DOCUMENTS

| | | |
|---|---|---|
| TW | M606668 | 1/2021 |
| WO | 2021232949 | 11/2021 |

OTHER PUBLICATIONS

Sparsh Mittal, "A survey of SRAM-based in-memory computing techniques and applications", Journal of Systems Architecture 119 (2021) 102276, Sep. 10, 2021, pp. 1-36.

Chih-Sheng Lin et al., "A 48 TOPS and 20943 TOPS/W 512kb Computation-in-SRAM Macro for Highly Reconfigurable Ternary CNN Acceleration", 2021 IEEE Asian Solid-State Circuits Conference (A-SSCC), Nov. 7-10, 2021, pp. 1-3.

Sayeed Ahmad et al., "A Robust 10T SRAM Cell with Enhanced Read Operation", International Journal of Computer Applications, vol. 129, No. 2, Nov. 17, 2015, pp. 1-7.

Ming-Chun Hong et al., "In-Memory Annealing Unit (IMAU): Energy-Efficient (2000 TOPS/W) Combinatorial Optimizer for Solving Travelling Salesman Problem", 2021 IEEE International Electron Devices Meeting (IEDM), Dec. 11-16, 2021, pp. 1-4.

"Office Action of Taiwan Counterpart Application", issued on Jul. 14, 2023, p. 1-p. 5.

* cited by examiner

MEMORY CELL

CROSS-REFERENCE TO RELATED APPLICATION

This application claims the priority benefit of Taiwanese application no. 111133890, filed on Sep. 7, 2022. The entirety of the above-mentioned patent application is hereby incorporated by reference herein and made a part of this specification.

BACKGROUND

Technical Field

The disclosure relates to a memory cell.

Description of Related Art

Conventional computing-in-memory (CIM) uses two 8T static random access memory (SRAM) cells (i.e., 16 transistors) to store a single complementary weight, which has a larger chip area and larger leakage current compared to a framework of one 8T SRAM cell (i.e., 8 transistors) to store a single complementary weight. However, its advantages such as high precision and high efficiency ratios are lacking in the frame work of one 8T SRAM cell. Therefore, how to design a memory cell framework that may improve a computing performance and reduce the number of transistors is one of the topics studied by technicians in the field.

SUMMARY

An embodiment of the disclosure provides a memory cell, which includes a first transistor, a second transistor, a weight storage circuit and a driving circuit. A first terminal of the first transistor is coupled to a bit line, and a first terminal of the second transistor is coupled to a bit line bar. The weight storage circuit is coupled between a gate terminal of the first transistor and a gate terminal of the second transistor, and stores a weight value. The driving circuit is coupled to a second terminal of the first transistor, a second terminal of the second transistor, and at least one word line, and receives at least one threshold voltage and receive at least one input data from the word line. The weight storage circuit determines to turn on the first transistor or the second transistor according to the weight value. The driving circuit determines whether to generate an operation current on a path of the turned-on first transistor or the turned-on second transistor according to the threshold voltage and the input data.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Embodiments of the disclosure provides a variety of memory cells, by using a new transistor connection framework, a single SRAM cell may complete the complementary CIM operation that is completed by two conventional SRAM cells, which may reduce the number of used transistors, and reduce the leakage current and the required chip area. In addition, the variety of memory cells of embodiments of the disclosure are further combined with operation transistors for subthreshold operation, which may achieve high parallel computation to improve computing performance in addition to reducing energy and load effect of the single SRAM cell during memory computation.

Figure 1:
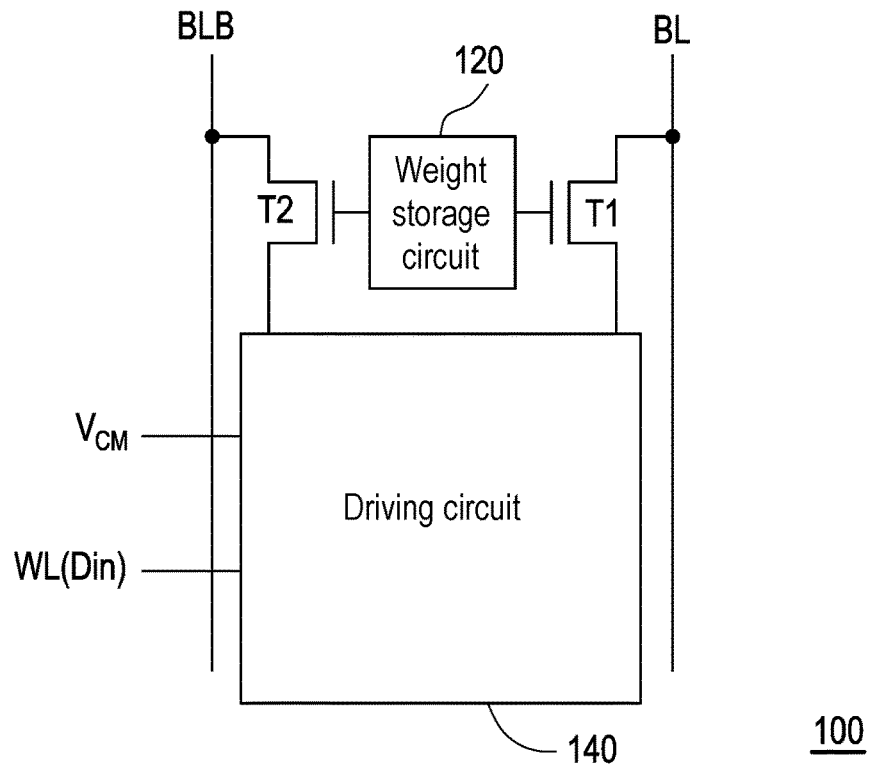
FIG. 1 is a block diagram of a memory cell according to an exemplary embodiment of the disclosure.

FIG. 1 is a block diagram of a memory cell according to an embodiment of the disclosure. Referring to FIG. 1, a memory cell 100 includes a transistor T1, a transistor T2, a weight storage circuit 120 and a driving circuit 140. A first terminal of the transistor T1 (one end of a source/drain) is coupled to a bit line BL, and a first terminal of the transistor T2 (one end of a source/drain) is coupled to a bit line bar BLB. The weight storage circuit 120 is coupled between a gate terminal of the transistor T1 and a gate terminal of the transistor T2, and the driving circuit 140 is coupled to a second terminal of the transistor T1 (the other end of the source/drain), a second terminal of the transistor T2 (the other end of the source/drain) and at least one word line WL.

In the embodiment of the disclosure, the weight storage circuit 120 stores a weight value, and the driving circuit 140 receives at least one threshold voltage $V_{CM}$ and receives at least one input data Din from the word line WL. Specifically, the weight storage circuit 120 determines to turn on the transistor T1 or T2 according to the weight value, and the driving circuit 140 determines whether to generate an operation current on a path of the turned-on transistor T1 or T2 according to the threshold voltage $V_{CM}$ and the input data Din.

In an embodiment, the transistors T1 and T2 are both N-type metal-oxide-semiconductor transistors, but the embodiment is not limited thereto. In an embodiment, the weight value is a single complementary weight. In another embodiment, the weight value is a ternary weight, but the embodiment is not limited thereto.

Figure 2:
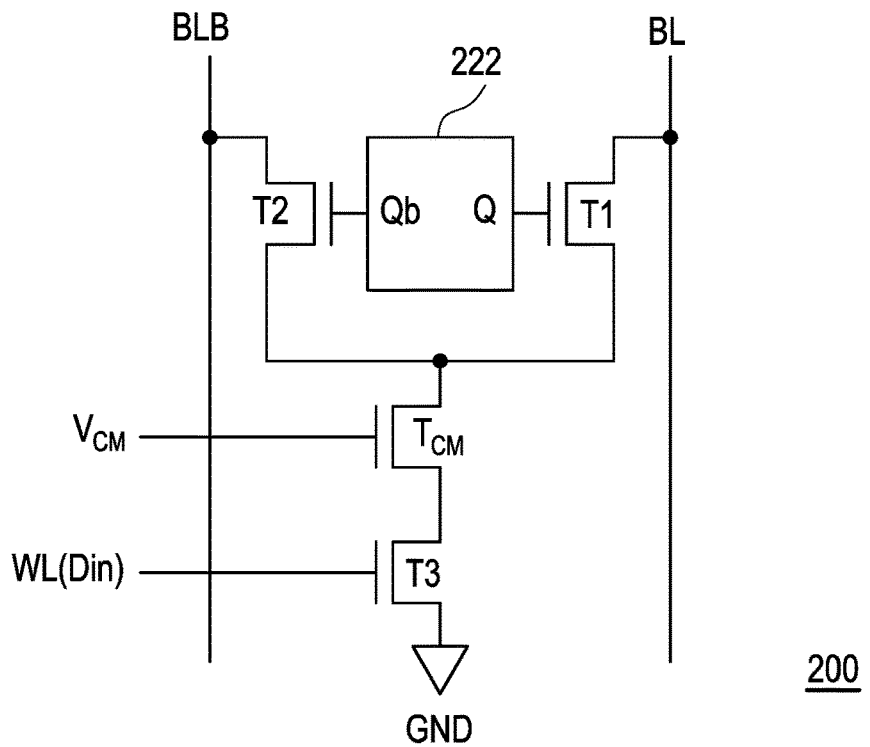
FIG. 2 is a circuit diagram of a memory cell according to a first embodiment of the disclosure.

FIG. 2 is a circuit diagram of a memory cell according to a first embodiment of the disclosure. Referring to FIG. 2, a memory cell 200 of FIG. 2 may be implemented as the memory cell 100 of FIG. 1. Detailed circuit structures of the components (the weight storage circuit 120 and the driving circuit 140) in the memory cell 200 are further discussed herein.

In the embodiment of the disclosure, the weight storage circuit 120 includes an SRAM cell 222. The SRAM cell 222 has a storage node Q and a storage node bar Qb, the storage node Q is coupled to the gate terminal of the transistor T1, and the storage node bar Qb is coupled to the gate terminal of the transistor T2.

In the embodiment of the disclosure, the driving circuit 140 includes an operational transistor $T_{CM}$ and a transistor T3. A first terminal (one end of a source/drain) of the operational transistor $T_{CM}$ is coupled to the second terminal (the other end of the source/drain) of the transistor T1 and the second terminal (the other end of the source/drain) of the transistor T2, and a gate terminal of the operational transistor $T_{CM}$ is coupled to the threshold voltage $V_{CM}$. A first terminal of the transistor T3 (one end of a source/drain) is coupled to the second terminal of the operational transistor $T_{CM}$ (the other end of the source/drain), a second terminal of the transistor T3 (the other end of the source/drain) is coupled to a ground voltage GND, and a gate terminal of the transistor T3 is coupled to the word line WL to receive the input data Din.

Operation of the memory cell 200 is described in detail below. The SRAM cell 222 of the memory cell 200 stores a weight value, and determines to turn on the transistor T1 or T2 according to output values of the storage node Q and the storage node bar Qb. Namely, the SRAM cell 222 determines to connect a path of the bit line BL or the bit line bar BLB to the operational transistor $T_{CM}$. At this time, if the operational transistor $T_{CM}$ operates at the threshold voltage $V_{CM}$, and the input data Din received by the transistor T3 from the word line WL is 1, an operation current $I_{CM}$ is generated on the path of the transistor T1 or T2 turned on by the SRAM cell 222; if the operational transistor $T_{CM}$ operates at the threshold voltage $V_{CM}$, and the input data Din received by the transistor T3 from the word line WL is 0, the operation current $I_{CM}$ cannot be generated on the path of the transistor T1 or T2 turned on by the SRAM cell 222. Finally, a sensing amplifier (not shown in the figure) compares a total operation current on the path of the bit line BL and a total operation current on the path of the bit line bar BLB to determine the output value.

In an embodiment, the sensing amplifier determines that the total operation current on the path of the bit line BL is greater than the total operation current on the path of the bit line bar BLB, which represents that a positive end current is larger, so that the sensing amplifier outputs 1; otherwise, the sensing amplifier determines that the total operation current on the path of the bit line BL is smaller than the total operation current on the path of the bit line bar BLB, which represents that a negative end current is larger, so that the sensing amplifier outputs 0.

Figure 3A:
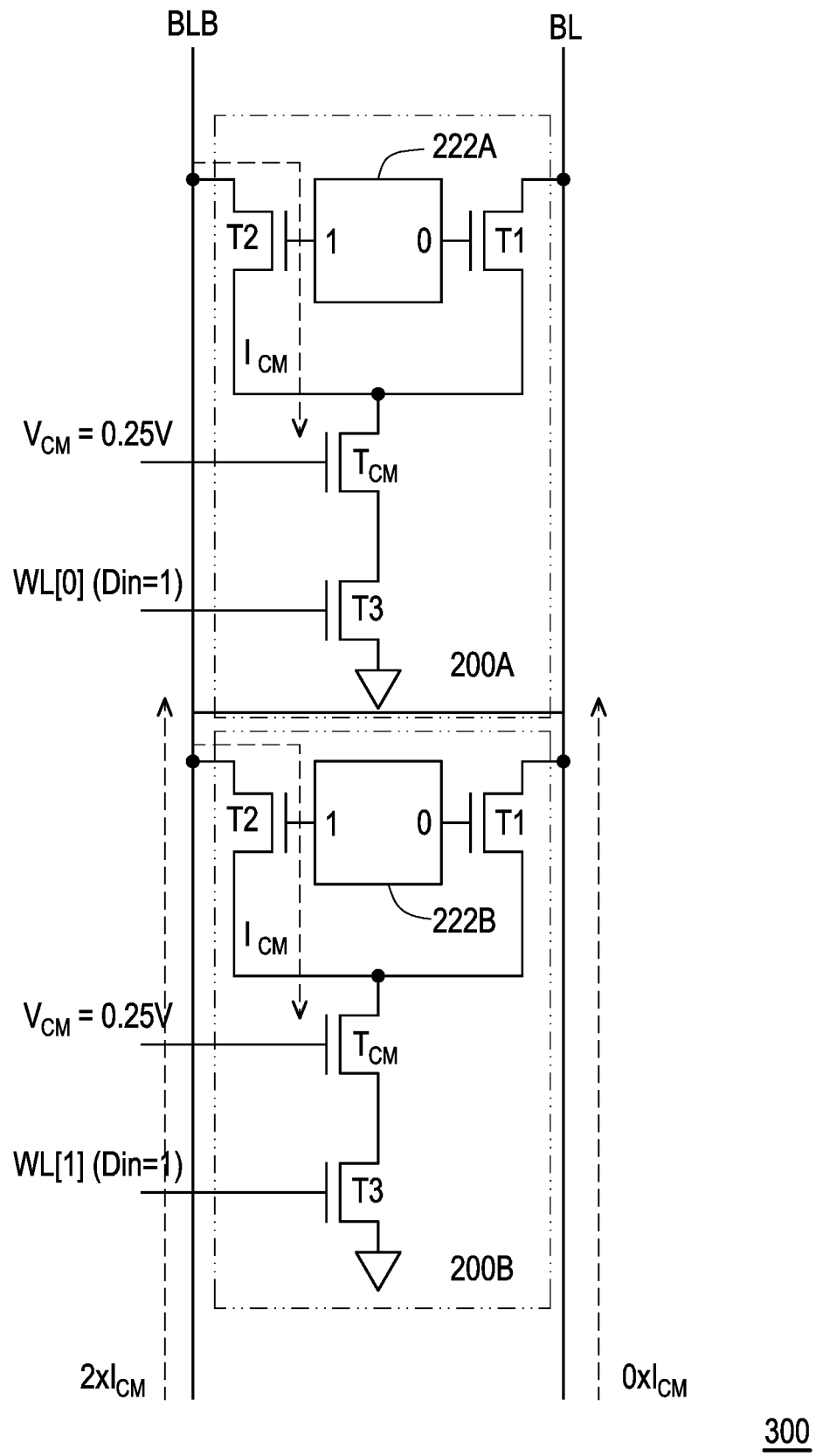
FIG. 3A and FIG. 3B are circuit operation diagrams of memory cells in a memory array according to the first embodiment of the disclosure.
Figure 3B:
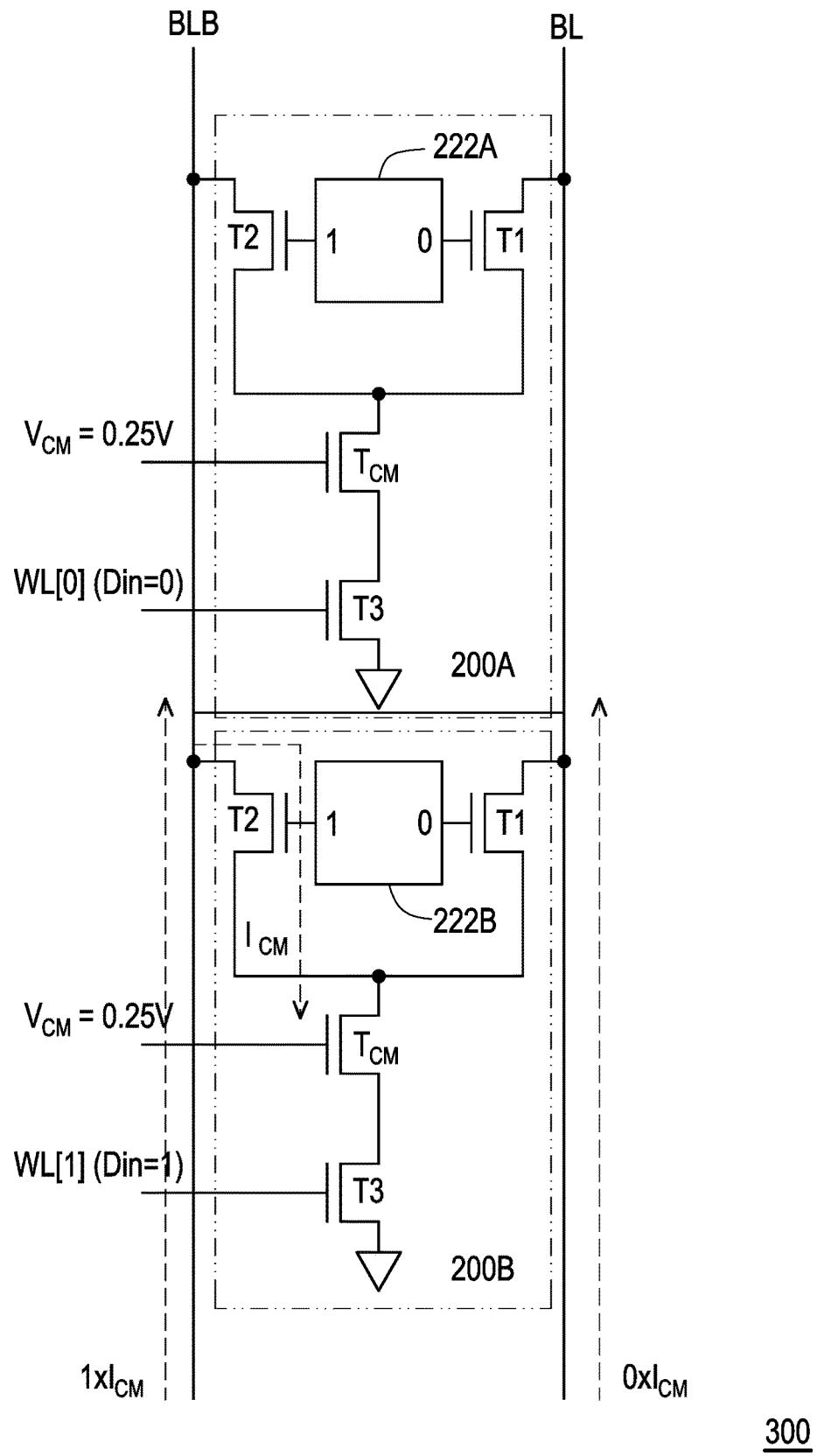

FIG. 3A and FIG. 3B are circuit operation diagrams of memory cells in a memory array according to the first embodiment of the disclosure. Referring to FIG. 3A and FIG. 3B, a memory array 300 includes memory cells 200A and 200B, and the memory cells 200A and 200B are the same as the memory cell 200 in FIG. 2. Circuit operations of the memory cells 200A and 200B in the memory array 300 are described below.

It should be noted that in the memory array 300 in FIG. 3A and FIG. 3B of the embodiment, two memory cells 200A and 200B are taken as an example for description, but those skilled in the art may appropriately adjust the number of memory cells according to an actual application situation, which is not limited by the embodiment.

In an embodiment, taking FIG. 3A as an example, two SRAM cells 222A and 222B both turn on the transistor T2 to connect the path of the bit line bar BLB to the operational transistor $T_{CM}$, and the operational transistor $T_{CM}$ operates at the threshold voltage $V_{CM}$ of 0.25V, and the input data Din received by the transistors T3 from word lines WL[0] and WL[1] is respectively 1. Therefore, the operation current $I_{CM}$ will be generated on the path of the transistors T2 turned on by the SRAM cells 222A and 222B.

Therefore, it may be seen that a total of 2 times of the operation current $I_{CM}$ is accumulated on the bit line bar BLB (i.e., the total operation current on the path of the bit line bar BLB=2×$I_{CM}$), and there is no operation current $I_{CM}$ accumulated on the bit line BL (i.e., the total operation current on the path of the bit line BL=0×$I_{CM}$). Finally, a sensing amplifier (not shown in the figure) determines that the total operation current on the path of the bit line bar BLB is greater than the total operation current on the path of the bit line BL, which represents that the negative end current is larger, so that the sensing amplifier outputs 0.

In another embodiment, taking FIG. 3B as an example, the two SRAM cells 222A and 222B both turn on the transistor T2 to connect the path of the bit line bar BLB to the operational transistor $T_{CM}$, and the operational transistor $T_{CM}$ operates at the threshold voltage $V_{CM}$ of 0.25V, and the input data Din received by the transistor T3 from the word lines WL[0] and WL[1] is respectively 0 and 1. Therefore, the transistor T3 of the memory cell 200A is turned off, and the path of the transistor T2 turned on by the SRAM cell 222A cannot generate the operation current $I_{CM}$ that flows through the operational transistor $T_{CM}$ to ground.

Therefore, a total of 1 time of the operation current $I_{CM}$ is accumulated on the bit line bar BLB (i.e., the total operation current on the path of the bit line bar BLB=1×$I_{CM}$), and there is no operation current $I_{CM}$ accumulated on the bit line BL (i.e., the total operation current on the path of the bit line BL=0×$I_{CM}$). Finally, a sensing amplifier (not shown in the figure) determines that the total operation current on the path of the bit line bar BLB is greater than the total operation current on the path of the bit line BL, which represents that the negative end current is larger, so that the sensing amplifier outputs 0.

Figure 4:
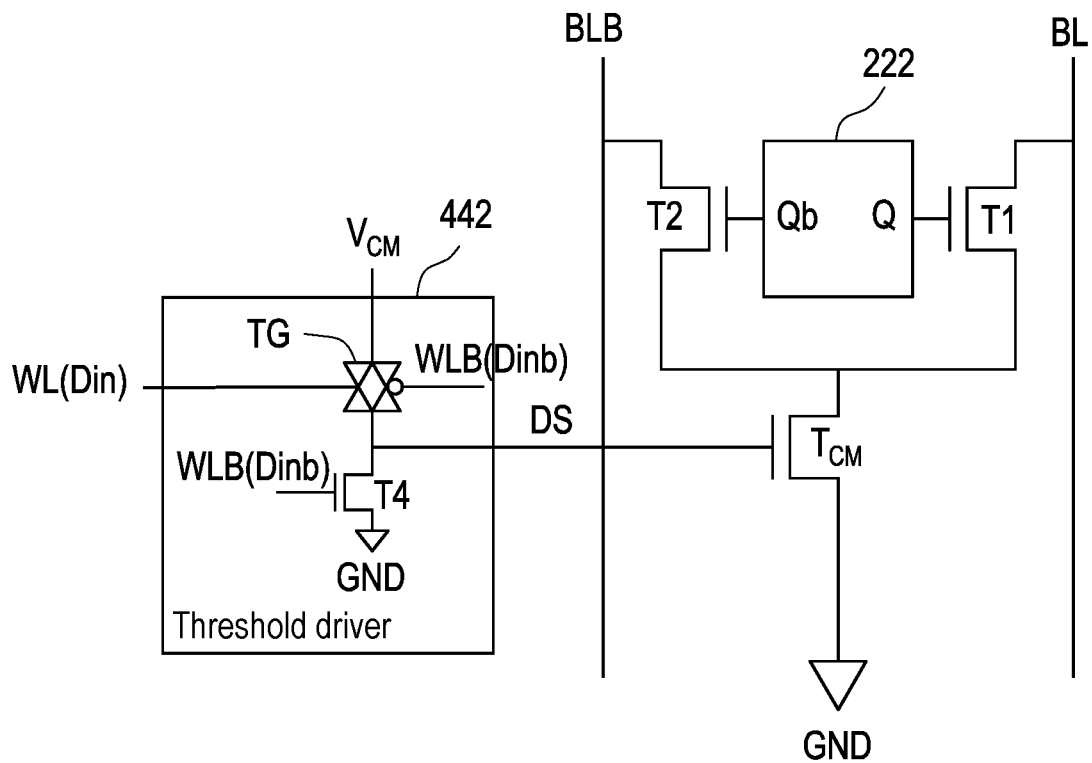
FIG. 4 is a circuit diagram of a memory cell according to a second embodiment of the disclosure.

FIG. 4 is a circuit diagram of a memory cell according to a second embodiment of the disclosure Referring to FIG. 4, a memory cell 400 of FIG. 4 may be implemented as the memory cell 100 of FIG. 1, a detailed circuit structure of each element (the weight storage circuit 120 and the driving circuit 140) in the memory cell 400 is further introduced below.

However, it should be noted that the weight storage circuit 120 of FIG. 4 is the same as the weight storage circuit 120 of FIG. 2. Therefore, further description below is mainly for the difference (the driving circuit 140).

In the embodiment of the disclosure, the driving circuit 140 includes a threshold driver 442 and the operational transistor $T_{CM}$. The threshold driver 442 is coupled to the word line WL, receives the input data Din from the word line WL and the threshold voltage $V_{CM}$, and generates a driving signal DS. A first terminal of the operational transistor $T_{CM}$ (one end of the source/drain) is coupled to the second terminal of the transistor T1 (the other end of the source/drain) and the second terminal of the transistor T2 (the other end of the source/drain). The second terminal of the operational transistor $T_{CM}$ (the other end of the source/drain) is coupled to the ground voltage GND, and the gate terminal of the operational transistor $T_{CM}$ is coupled to the threshold driver 442 to receive the driving signal DS.

In an embodiment, the threshold driver 442 includes a transmission gate TG and a transistor T4. An input terminal of the transmission gate TG is coupled to the threshold voltage $V_{CM}$, and the transmission gate TG is turned on or off according to the input data Din and inverted input data Dinb. A first terminal of the transistor T4 (one end of the source/drain) is coupled to an output terminal of the transmission gate TG, a second terminal of the transistor T4 (the other end of the source/drain) is coupled to the ground voltage GND, and a gate terminal of the transistor T4 is coupled to a word line bar WLB to receive the inverted input data Dinb. The threshold driver 442 outputs the driving signal DS at an output terminal of the transmission gate TG.

In detail, when the input data Din received from the word line WL is 1, the inverted input data Dinb received from the word line bar WLB is 0, so that the transmission gate TG is turned on and the transistor T4 is turned off to output the threshold voltage $V_{CM}$ (i.e., the driving signal DS is 1). Conversely, when the input data Din received from the word line WL is 0, the inverted input data Dinb received from the word line bar WLB is 1, the transmission gate TG is not turned on and the transistor T4 is turned on to output the ground voltage GND (i.e., the driving signal DS is 0).

Operation of the memory cell 400 is described below. The SRAM cell 222 of the memory cell 400 stores a weight value and determines to turn on the transistor T1 or T2 according to the output values of the storage node Q and the storage node bar Qb. Namely, the SRAM cell 222 determines to connect the path of the bit line BL or the bit line bar BLB to the operational transistor $T_{CM}$. At this time, if the operational transistor $T_{CM}$ receives the threshold voltage $V_{CM}$ from the threshold driver 442 (i.e., the driving signal DS is 1), the operation current $I_{CM}$ will be generated on the path of the transistor T1 or T2 turned on by the SRAM cell 222; if the operational transistor $T_{CM}$ receives the ground voltage GND from the threshold driver 442 (i.e., the driving signal DS is 0), the operation current $I_{CM}$ cannot be generated on the path of the transistor T1 or T2 turned on by the SRAM cell 222. Finally, a sensing amplifier (not shown in the figure) compares the total operation current on the path of the bit line BL with the total operation current on the path of the bit line bar BLB to determine the output value.

In an embodiment, the sensing amplifier determines that the total operation current on the path of the bit line BL is greater than the total operation current on the path of the bit line bar BLB, which represents that the positive end current is larger, so that the sensing amplifier outputs 1; on the contrary, the sensing amplifier determines that the total operation current on the path of the bit line BL is less than the total operation current on the path of the bit line bar BLB, which represents that the negative end current is larger, so that the sensing amplifier outputs 0.

Figure 5A:
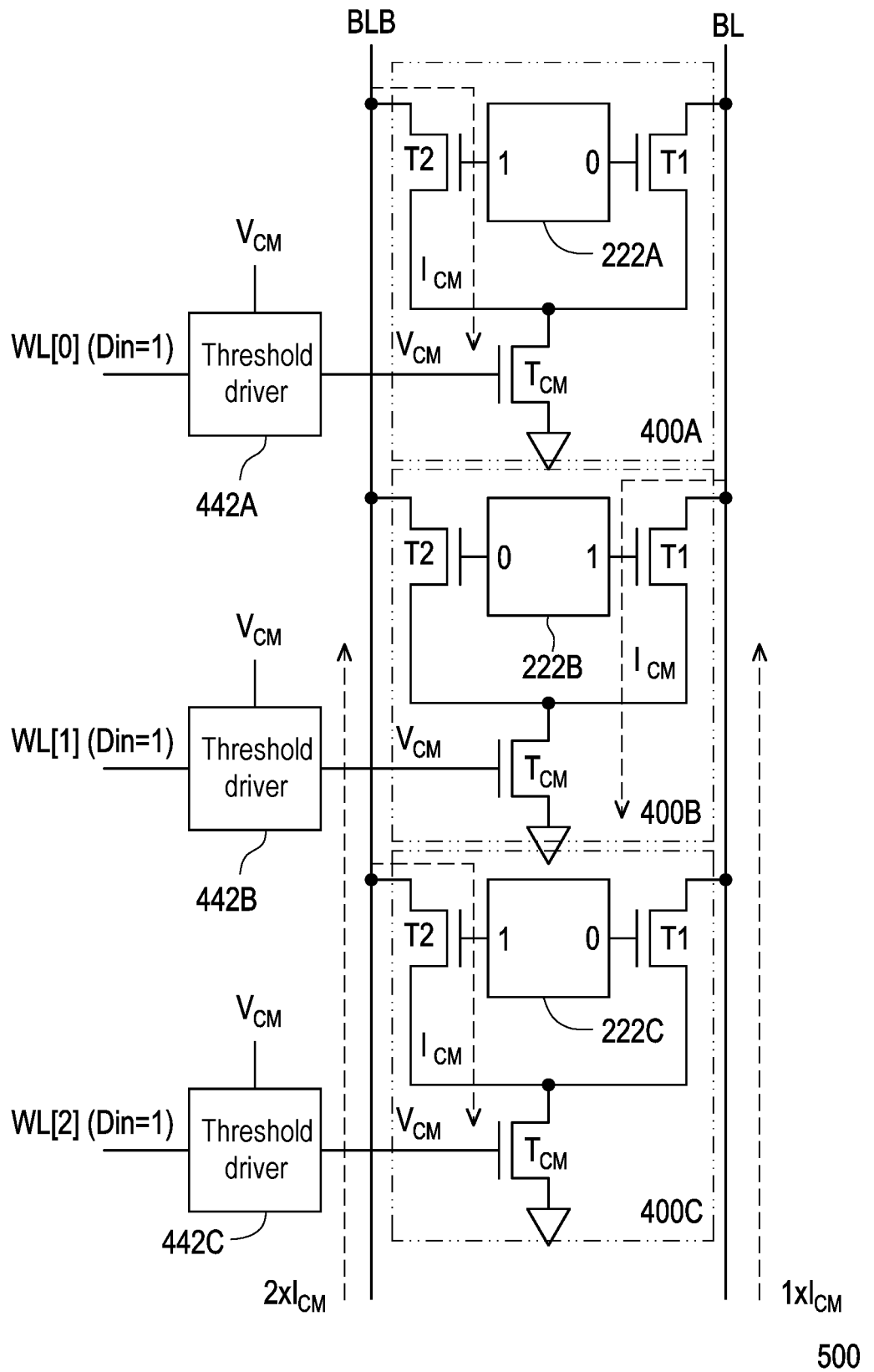
FIG. 5A and FIG. 5B are circuit operation diagrams of memory cells in a memory array according to the second embodiment of the disclosure.
Figure 5B:
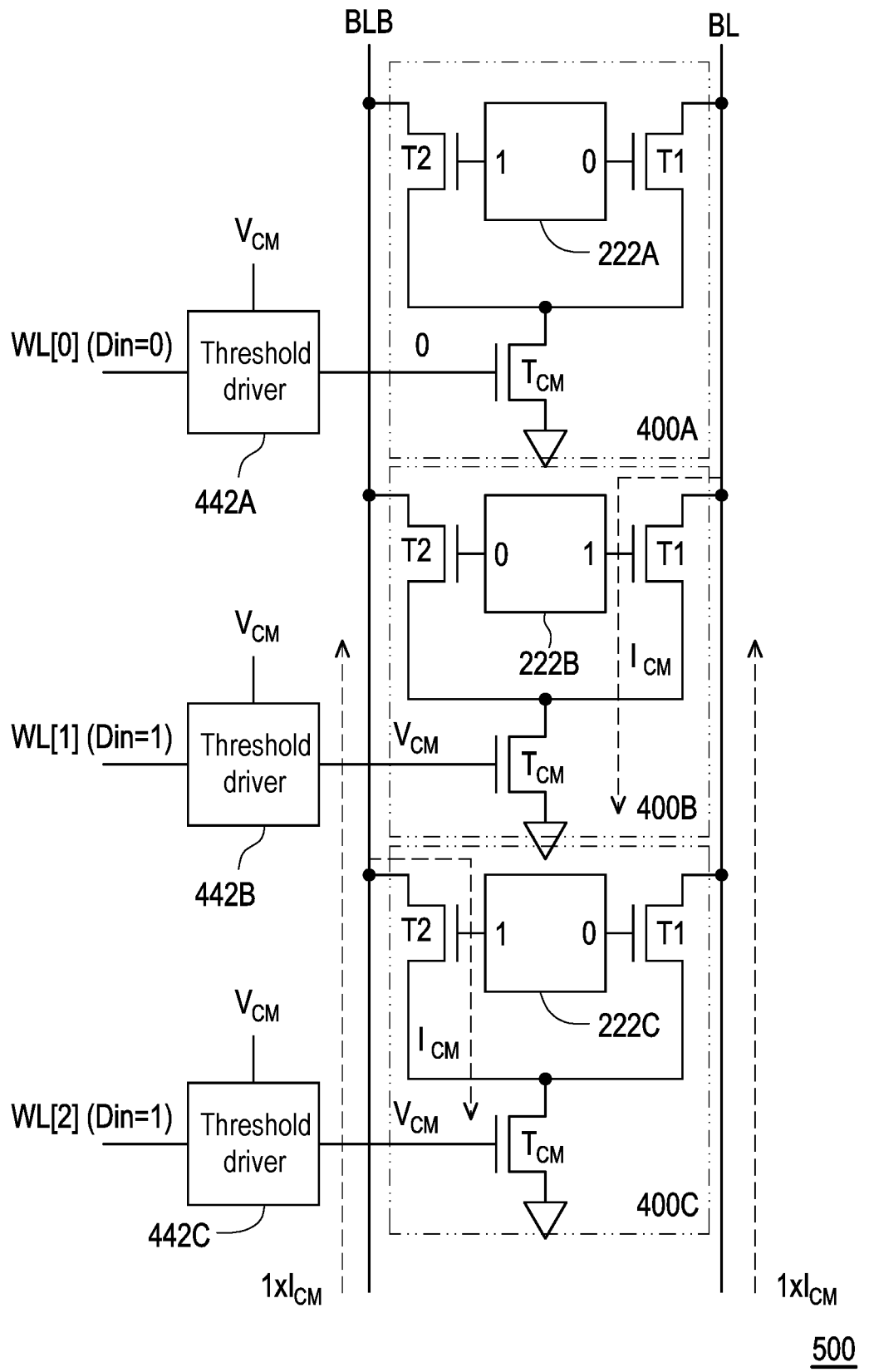

FIG. 5A and FIG. 5B are circuit operation diagrams of memory cells in a memory array according to the second embodiment of the disclosure. Referring to FIG. 5A and FIG. 5B, a memory array 500 includes memory cells 400A, 400B and 400C, and the memory cells 400A, 400B and 400C are the same as the memory cell 400 in FIG. 4. Circuit operations of the memory cells 400A, 400B and 400C in the memory array 500 are mainly described below.

It should be noted that, three memory cells 400A, 400B and 400C illustrated in the memory array 500 of FIG. 5A and FIG. 5B are as an example for description, but those with ordinary knowledge in the art may adjust the number of memory cells according to an actual application situation, which is not limited by the embodiment.

In an embodiment, taking FIG. 5A as an example, the SRAM cell 222A and a SRAM cell 222C turn on the transistor T2 to connect the path of the bit line bar BLB to the operational transistor $T_{CM}$, and the SRAM cell 222B turns on the transistor T1 to connect the path of the bit line BL to the operational transistor $T_{CM}$. The input data Din received by threshold drivers 442A, 442B and 442C from the word lines WL[0], WL[1] and WL[2] are all 1, so that the threshold drivers 442A, 442B and 442C all output the threshold voltage $V_{CM}$ (i.e., the driving signal DS is 1) to make the operational transistor $T_{CM}$ operating at the threshold voltage $V_{CM}$. Therefore, the operation current $I_{CM}$ is generated on the path of the transistor T2 turned on by the SRAM cells 222A and 222C and the path of the transistor T1 turned on by the SRAM cell 222B.

Therefore, it may be seen that a total of 2 times of the operation current $I_{CM}$ is accumulated on the bit line bar BLB (i.e., the total operation current on the path of the bit line bar BLB=2×$I_{CM}$), while on the bit line BL, a total of 1 time of the operation current $I_{CM}$ is accumulated (i.e., the total operation current on the path of the bit line BL=1×$I_{CM}$). Finally, a sensing amplifier (not shown in the figure) determines that the total operation current on the path of the bit line bar BLB is greater than the total operation current on the path of the bit line BL, which represents that the negative end current is larger, so that the sensing amplifier outputs 0.

In another embodiment, taking FIG. 5B as an example, the SRAM cells 222A and 222C turn on the transistor T2 to connect the path of the bit line bar BLB to the operational transistor $T_{CM}$, and the SRAM cell 222B turns on the transistor T1 to connect the path of the bit line BL to the operational transistor $T_{CM}$. The input data Din respectively received by the threshold drivers 442A, 442B and 442C from the word lines WL[0], WL[1] and WL[2] are 0, 1 and 1, so that the threshold drivers 442A, 442B and 442C respectively output the ground voltage GND, the threshold voltage $V_{CM}$, and the threshold voltage $V_{CM}$ (i.e., the driving signals DS are 0, 1, and 1 respectively) to make the operational transistor $T_{CM}$ operating at the ground voltage GND, the threshold voltage $V_{CM}$, and the threshold voltage $V_{CM}$, respectively. Therefore, the transistor $T_{CM}$ of the memory cell 400A is turned off, and the path of the transistor T2 turned on by the SRAM cell 222A cannot generate the operation current $I_{CM}$ that flows through the operational transistor $T_{CM}$ to ground.

Therefore, it may be seen that a total of 1 time of the operation current $I_{CM}$ is accumulated on the bit line bar BLB (i.e., the total operation current on the path of the bit line bar BLB=1×$I_{CM}$), while on the bit line BL, a total of 1 time of the operation current $I_{CM}$ is accumulated (i.e., the total operation current on the path of the bit line BL=1×$I_{CM}$). Finally, a sensing amplifier (not shown in the figure) determines that the total operation current on the path of the bit line bar BLB is equal to the total operation current on the path of the bit line BL, which represents that the negative end current and the positive end current are the same, and the output value cannot be determined under such condition. In an embodiment, under such condition, a designed fixed output value of the sensing amplifier design is tended to be output, for example, the sensing amplifier may have a fixed output of 0.

Figure 6:
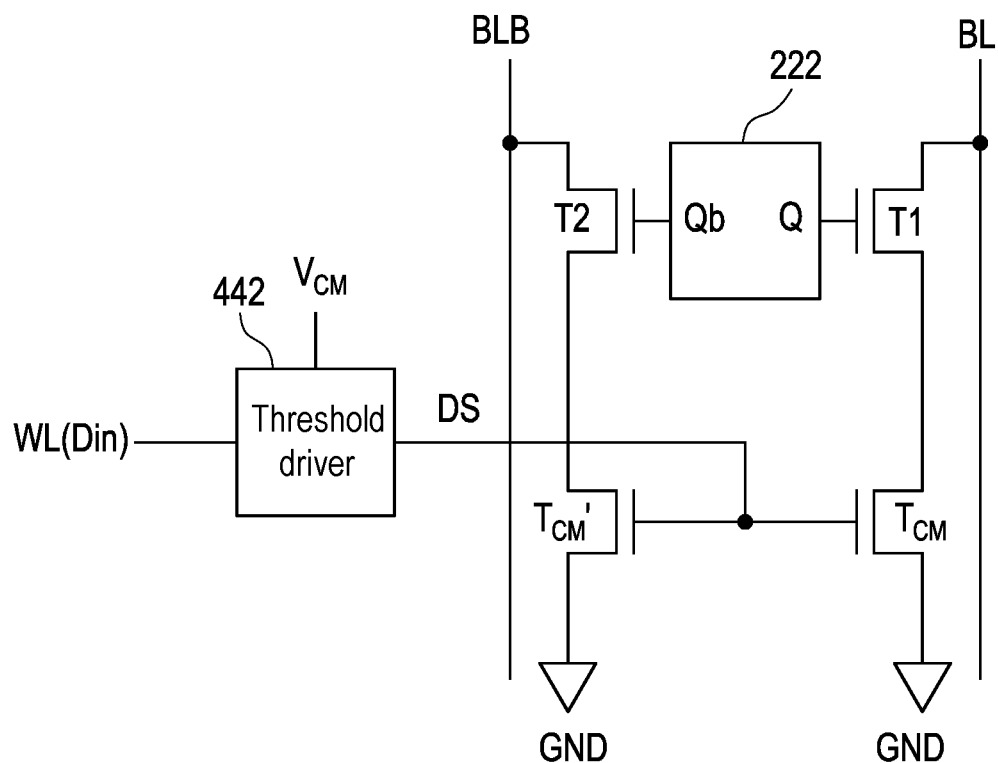
FIG. 6 is a circuit diagram of a memory cell according to a third embodiment of the disclosure.

FIG. 6 is a circuit diagram of a memory cell according to a third embodiment of the disclosure. Referring to FIG. 6, a memory cell 600 of FIG. 6 may be implemented as the memory cell 100 of FIG. 1, and detailed circuit structures of the components (the weight storage circuit 120 and the driving circuit 140) in the memory cell 600 are further described below.

However, it should be noted that the weight storage circuit 120 of FIG. 6 is the same as the weight storage circuit 120 of FIG. 2. Therefore, further description below is mainly for the difference (the driving circuit 140).

In the embodiment of the disclosure, the driving circuit 140 includes the threshold driver 442 and operational transistors $T_{CM}$ and $T_{CM}'$. It should be noted that the threshold driver 442 of FIG. 6 is the same as the threshold driver 442 of FIG. 4, so that detail thereof is not repeated. A first terminal of the operational transistor $T_{CM}$ (one end of the source/drain) is coupled to a second terminal of the transistor T1 (the other end of the source/drain), and a first terminal of the operational transistor $T_{CM}'$ (one end of the source/drain) is coupled to a second terminal of the transistor T2 (the other end of the source/drain), and second terminals (the other ends of the source/drain) of the operational transistors $T_{CM}$ and $T_{CM}'$ are both coupled to the ground voltage GND, and gate terminals of the operational transistors $T_{CM}$ and $T_{CM}'$ are coupled to the threshold driver 442 to receive the driving signal DS.

The operation of the memory cell 600 is described in detail below. The SRAM cell 222 of the memory cell 600 stores a weight value, and determines to turn on the transistor T1 or T2 according to the output values of the storage node Q and the storage node bar Qb. Namely, the SRAM cell 222 determines to connect the path of the bit line BL or the bit line bar BLB to the operational transistor $T_{CM}$ or $T_{CM}'$. At this time, if the operational transistors $T_{CM}$ and $T_{CM}'$ receive the threshold voltage $V_{CM}$ from the threshold driver 442 (i.e., the driving signal DS is 1), the operation current $I_{CM}$ will be generated on the path of the transistor T1 or T2 turned on by the SRAM cell 222; if the operational transistors $T_{CM}$ and $T_{CM}'$ receive the ground voltage GND from the threshold driver 442 (i.e., the driving signal DS is 0), the operation current $I_{CM}$ cannot be generated on the path of the transistor T1 or T2 turned on by the SRAM cell 222. Finally, a sensing amplifier (not shown in the figure) compares the total operation current on the path of the bit line BL with the total operation current on the path of the bit line bar BLB to determine the output value.

In an embodiment, the sensing amplifier determines that the total operation current on the path of the bit line BL is greater than the total operation current on the path of the bit line bar BLB, which represents that the positive end current is larger, so that the sensing amplifier outputs 1; on the contrary, the sensing amplifier determines that the total operation current on the path of the bit line BL is less than the total operation current on the path of the bit line bar BLB, which represents that the negative end current is larger, so that the sensing amplifier outputs 0.

Figure 7A:
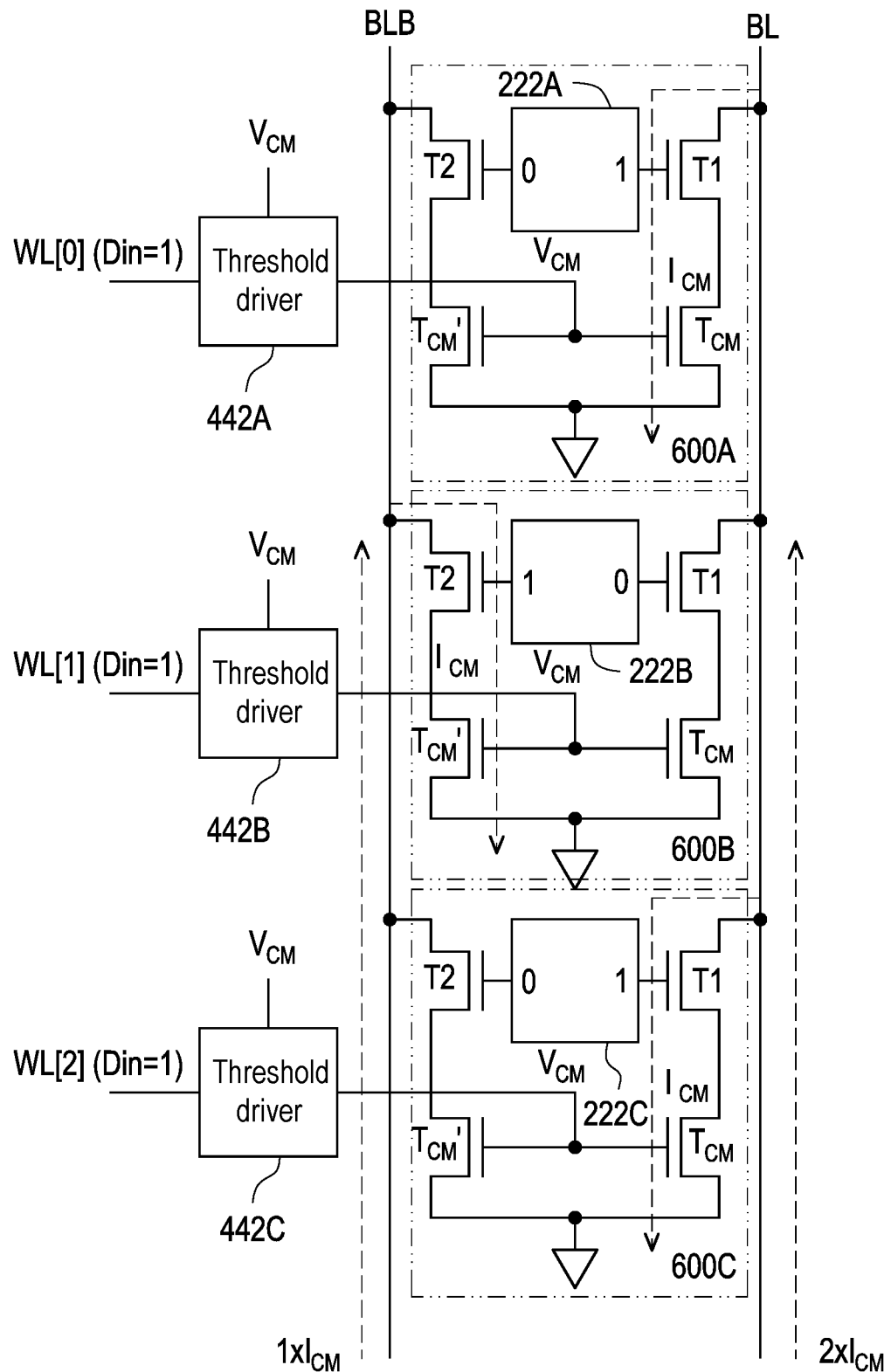
FIG. 7A and FIG. 7B are circuit operation diagrams of memory cells in a memory array according to the third embodiment of the disclosure.
Figure 7B:
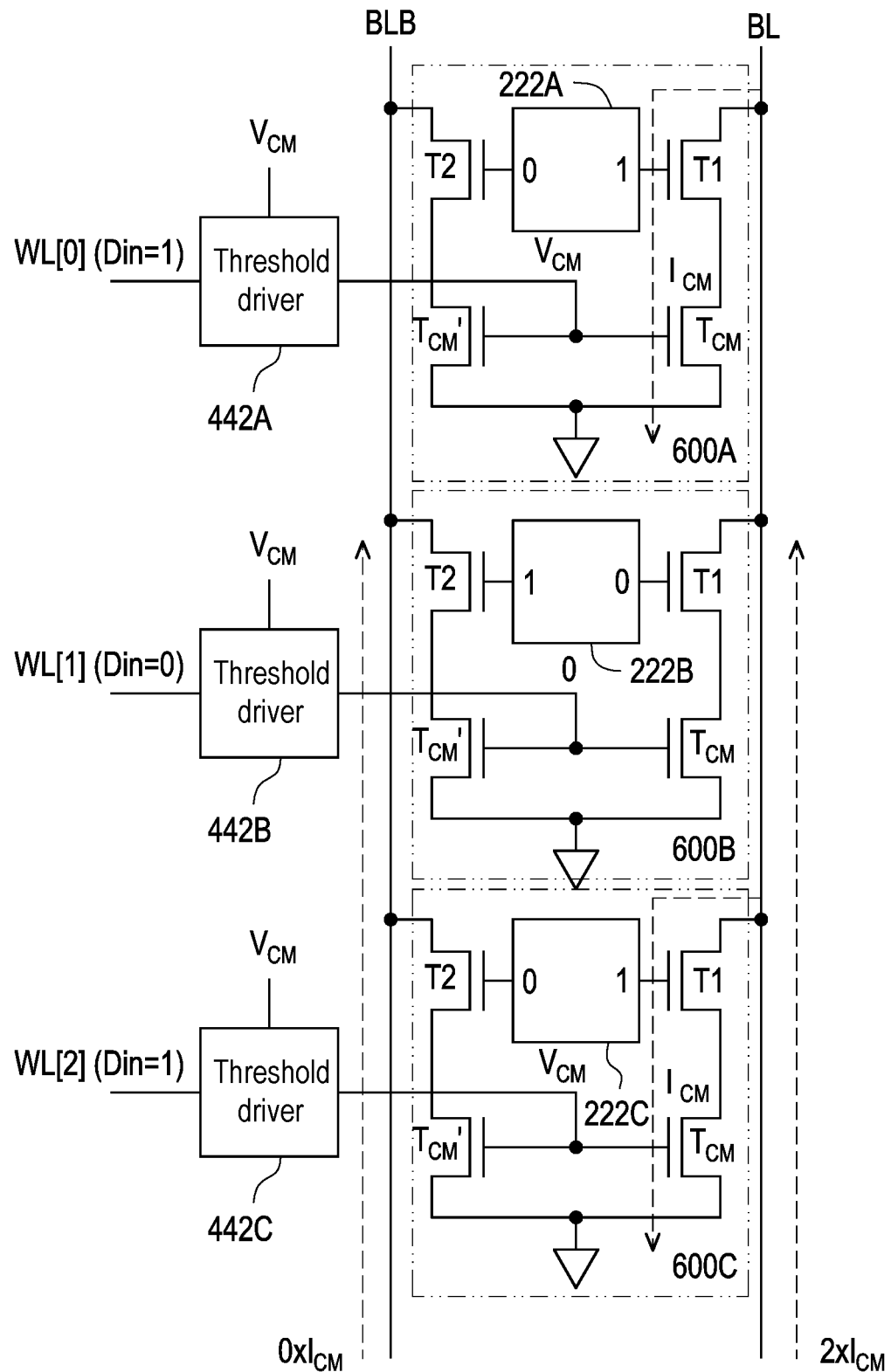

FIG. 7A and FIG. 7B are circuit operation diagrams of memory cells in a memory array according to the third embodiment of the disclosure. Referring to FIG. 7A and FIG. 7B, a memory array 700 includes memory cells 600A, 600B and 600C, and the memory cells 600A, 600B and 600C are the same as the memory cell 600 in FIG. 6. Circuit operations of the memory cells 600A, 600B and 600C in the memory array 700 are described below.

It should be noted that in the memory array 700 of FIG. 7A and FIG. 7B of the embodiment, three memory cells 600A, 600B, and 600C are taken as an example for description, but those skilled in the art may appropriately adjust the number of memory cells according to an actual application situation, which is not limited by the embodiment.

In one embodiment, taking FIG. 7A as an example, the SRAM cells 222A and 222C turn on the transistor T1 to connect the path of the bit line BL to the operational transistor $T_{CM}$, and the SRAM cell 222B turns on the transistor T2 to connect the path of the bit line bar BLB to the operational transistor $T_{CM}'$. The input data Din respectively received from the word lines WL[0], WL[1] and WL[2] by the threshold drivers 442A, 442B and 442C are all 1, and the threshold drivers 442A, 442B and 442C all output the threshold voltage $V_{CM}$ (i.e., the driving signal DS is 1) so that the operational transistor $T_{CM}$ of the memory cells 600A and 600C and the operational transistor $T_{CM}'$ of the memory cell 600B operate at the threshold voltage $V_{CM}$. Therefore, the operation current $I_{CM}$ is generated on the path of the transistor T1 turned on by the SRAM cells 222A and 222C and the path of the transistor T2 turned on by the SRAM cell 222B.

Therefore, a total of 2 times of the operation current $I_{CM}$ is accumulated on the bit line BL (i.e., the total operation current on the path of the bit line BL=2×$I_{CM}$), and a total of 1 time of the operation current $I_{CM}$ is accumulated on the bit line bar BLB (i.e., the total operation current on the path of the bit line bar BLB=1×$I_{CM}$). Finally, a sensing amplifier (not shown in the FIG. determines that the total operation current on the path of the bit line BL is greater than the total operation current on the path of the bit line bar BLB, which represents that the positive end current is larger, so that the sensing amplifier outputs 1.

In another embodiment, taking FIG. 7B as an example, the SRAM cells 222A and 222C turn on the transistor T1 to connect the path of the bit line BL to the operational transistor $T_{CM}$, and the SRAM cell 222B turns on the transistor T2 to connect the path of the bit line bar BLB to the operational transistor $T_{CM}'$. The input data Din respectively received from the word lines WL[0], WL[1] and WL[2] by the threshold drivers 442A, 442B and 442C are respectively 1, 0, 1, so that the threshold drivers 442A, 442B, and 442C respectively output the threshold voltage $V_{CM}$, the ground voltage GND, and the threshold voltage $V_{CM}$ (i.e., the driving signals DS are 1, 0, and 1, respectively) to respectively make the operational transistor $T_{CM}$ operating at the threshold voltage $V_{CM}$, the ground voltage GND and the threshold voltage $V_{CM}$. Therefore, the transistor $T_{CM}{}'$ of the memory cell 600B is turned off, and the path of the transistor T2 turned on by the SRAM cell 222B cannot generate the operation current $I_{CM}$ that flows through the operational transistor $T_{CM}{}'$ to ground.

Therefore, a total of 2 times of the operation current $I_{CM}$ is accumulated on the bit line BL (i.e., the total operation current on the path of the bit line BL=2×$I_{CM}$), and no operation current $I_{CM}$ is accumulated on the bit line bar BLB (i.e., the total operation current on the path of the bit line bar BLB=0×$I_{CM}$). Finally, a sensing amplifier (not shown in the figure) determines that the total operation current on the path of the bit line BL is greater than the total operation current on the path of the bit line bar BLB, which represents that the positive end current is larger, so that the sensing amplifier outputs 1.

Figure 8:
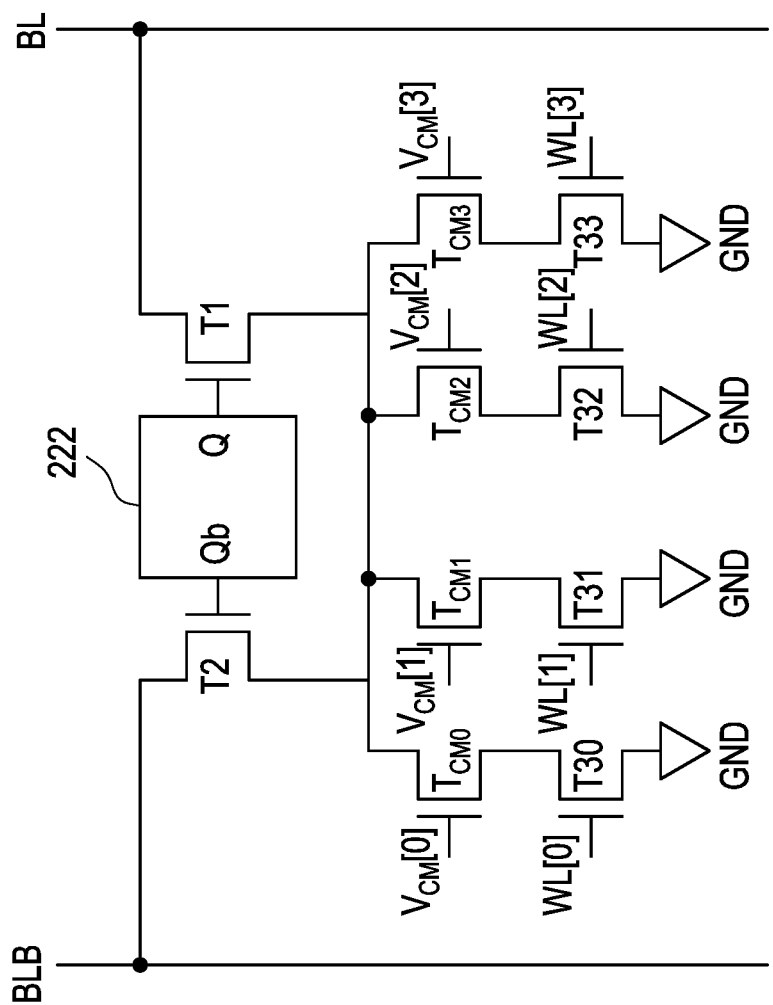
FIG. 8 is a circuit diagram of a memory cell according to a fourth embodiment of the disclosure.

FIG. 8 is a circuit diagram of a memory cell according to a fourth embodiment of the disclosure. Referring to FIG. 8, a memory cell 800 of FIG. 8 may be implemented as the memory cell 100 of FIG. 1. The detailed circuit structures of various components (the weight storage circuit 120 and the driving circuit 140) in the memory cell 800 are further described below.

However, it should be noted that the weight storage circuit 120 of FIG. 8 is the same as the weight storage circuit 120 of FIG. 2. Therefore, further description below is mainly for the difference (the driving circuit 140).

In the embodiment of the disclosure, the driving circuit 140 includes operational transistors $T_{CM0}$, $T_{CM1}$, $T_{CM2}$, and $T_{CM3}$ and transistors T30, T31, T32, and T33. First terminals (one ends of the sources/drains) of the operational transistors $T_{CM0}$, $T_{CM1}$, $T_{CM2}$, and $T_{CM3}$ are all coupled to the second terminal (the other end of the source/drain) of the transistor T1 and the second terminal (the other end of the source/drain) of the transistor T2, and gate terminals of the operational transistors $T_{CM0}$, $T_{CM1}$, $T_{CM2}$, and $T_{CM3}$ are respectively coupled to threshold voltages $V_{CM}[0]$, $V_{CM}[1]$, $V_{CM}[2]$, $V_{CM}[3]$. First terminals (one ends of the sources/drains) of the transistors T30, T31, T32, and T33 are respectively coupled to second terminals (the other ends of the sources/drains) of the operational transistors $T_{CM0}$, $T_{CM1}$, $T_{CM2}$, and $T_{CM3}$, the second terminals (the other terminals of the sources/drains) of the transistors T30, T31, T32, and T33 are all coupled to the ground voltage GND, and the gate terminals of the transistors T30, T31, T32, and T33 are respectively coupled to the word lines WL[0], WL[1], WL[2], WL[3] to receive the input data Din.

Operation of the memory cell 800 in FIG. 8 may be deduced according to the operation of the memory cell 200 in FIG. 2, and detail thereof is not repeated here. It should be noted that the embodiment takes the memory cell 800 receiving an input data of 4 bits as an example, but those skilled in the art may appropriately adjust the number of bits of the input data and the number of transistors according to an actual application situation, which is not limited by the embodiment.

Figure 9:
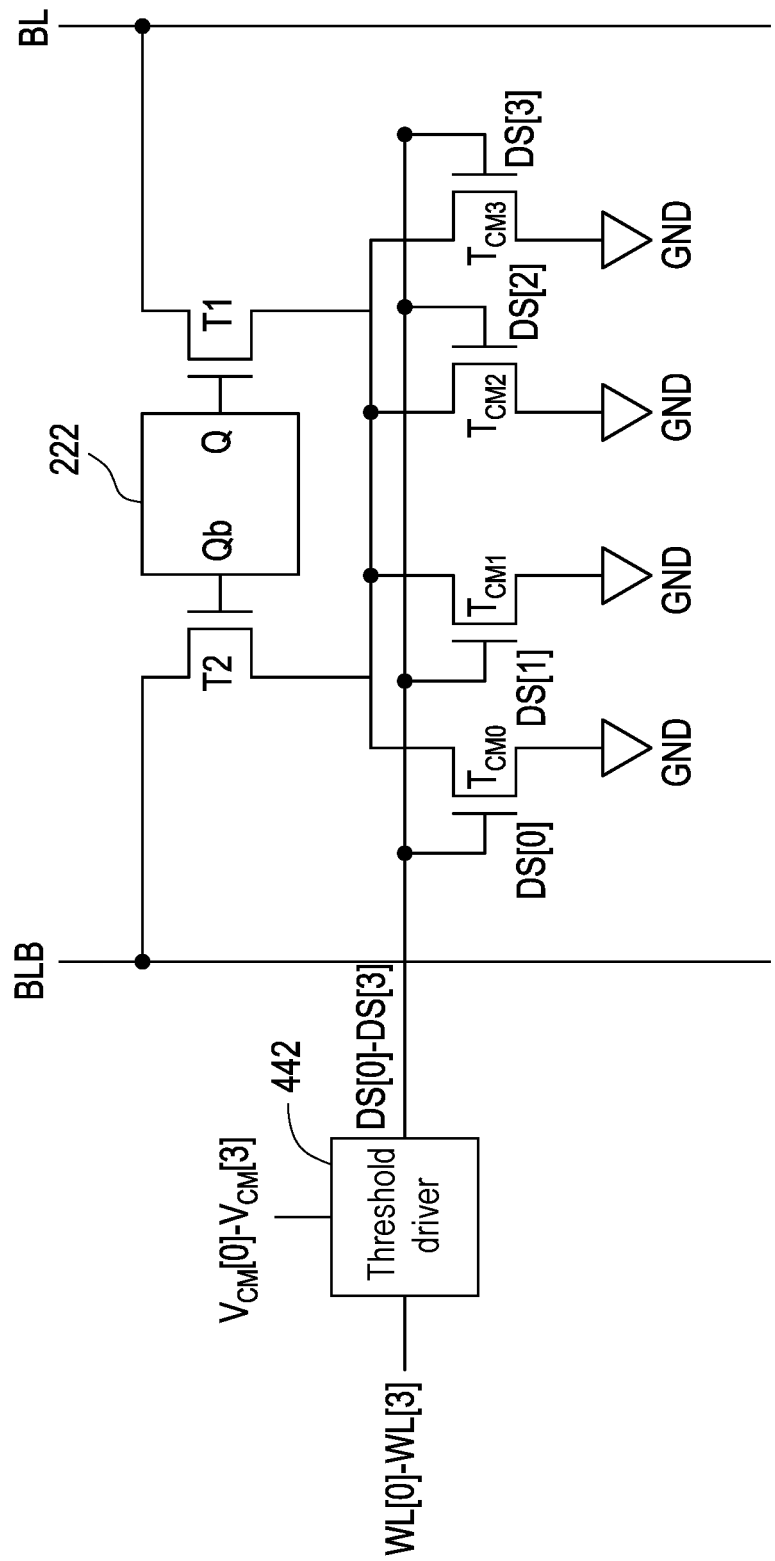
FIG. 9 is a circuit diagram of a memory cell according to a fifth embodiment of the disclosure.

FIG. 9 is a circuit diagram of a memory cell according to a fifth embodiment of the disclosure. Referring to FIG. 9, a memory cell 900 of FIG. 9 may be implemented as the memory cell 100 of FIG. 1. The detailed circuit structures of various components (the weight storage circuit 120 and the driving circuit 140) in the memory cell 900 are further described below.

However, it should be noted that the weight storage circuit 120 of FIG. 9 is the same as the weight storage circuit 120 of FIG. 2. Therefore, further description below is mainly for the difference (the driving circuit 140).

In the embodiment of the disclosure, the driving circuit 140 includes the threshold driver 442 and the operational transistors $T_{CM0}$, $T_{CM1}$, $T_{CM2}$, and $T_{CM3}$. It should be noted that the threshold driver 442 of FIG. 9 is the same as the threshold driver 442 of FIG. 4, so that detail thereof is not repeated. First terminals (one ends of the sources/drains) of the operational transistors $T_{CM0}$, $T_{CM1}$, $T_{CM2}$, and $T_{CM3}$ are all coupled to the second terminal (the other end of the source/drain) of the transistor T1 and the second terminal (the other end of the source/drain) of the transistor T2, second terminals (the other ends of the sources/drains) of the operational transistors $T_{CM0}$, $T_{CM1}$, $T_{CM2}$, and $T_{CM3}$ are all coupled to the ground voltage GND, and gate terminals of the operational transistors $T_{CM0}$, $T_{CM1}$, $T_{CM2}$, and $T_{CM3}$ are coupled to the threshold driver 442 to respectively receive driving signals DS[0], DS[1], DS[2], DS[3].

Operation of the memory cell 900 in FIG. 9 may be deduced according to the operation of the memory cell 400 in FIG. 4, and detail thereof is not repeated here. It should be noted that the embodiment takes the memory cell 900 receiving an input data of 4 bits as an example, but those skilled in the art may appropriately adjust the number of bits of the input data and the number of transistors according to an actual application situation, which is not limited by the embodiment.

Figure 10:
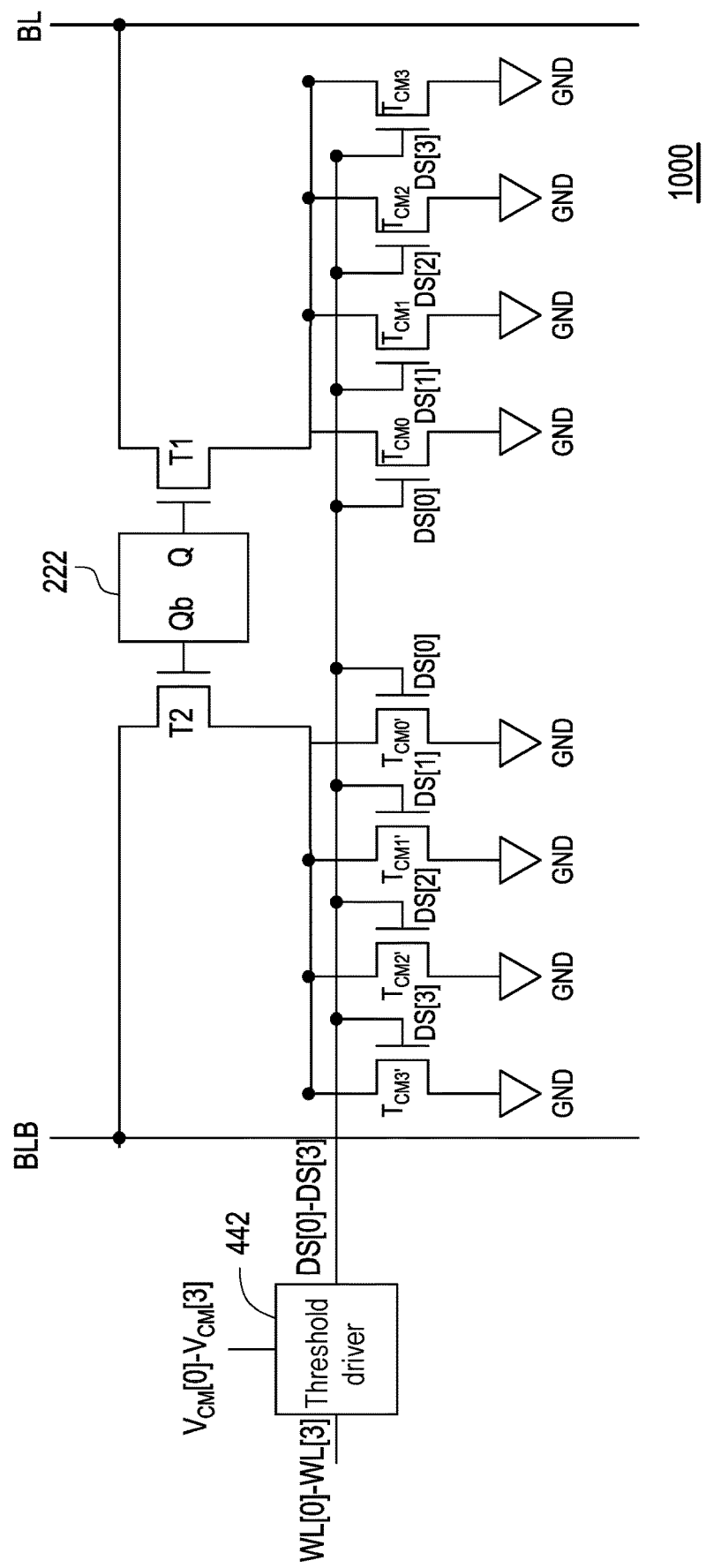
FIG. 10 is a circuit diagram of a memory cell according to a sixth embodiment of the disclosure.

FIG. 10 is a circuit diagram of a memory cell according to a sixth embodiment of the disclosure. Referring to FIG. 10, a memory cell 1000 of FIG. 10 may be implemented as the memory cell 100 of FIG. 1. The detailed circuit structures of various components (the weight storage circuit 120 and the driving circuit 140) in the memory cell 1000 are further described below.

However, it should be noted that the weight storage circuit 120 of FIG. 10 is the same as the weight storage circuit 120 of FIG. 2. Therefore, further description below is mainly for the difference (the driving circuit 140).

In the embodiment of the disclosure, the driving circuit 140 includes the threshold driver 442 and operational transistors $T_{CM0}$, $T_{CM1}$, $T_{CM2}$, $T_{CM3}$, $T_{CM0}{}'$, $T_{CM1}{}'$, $T_{CM2}{}'$, and $T_{CM3}{}'$. It should be noted that the threshold driver 442 of FIG. 10 is the same as the threshold driver 442 of FIG. 4, so that detail thereof is not repeated. First terminals (one ends of the sources/drains) of the operational transistors $T_{CM0}$, $T_{CM1}$, $T_{CM2}$, and $T_{CM3}$ are all coupled to the second terminal (the other end of the source/drain) of the transistor T1, first terminals (one ends of the sources/drains) of the operational transistors $T_{CM0}{}'$, $T_{CM1}{}'$, $T_{CM2}{}'$, and $T_{CM3}{}'$ are all coupled to the second terminal (the other end of the source/drain) of the transistor T2, second terminals (the other ends of the sources/drains) of the operational transistors $T_{CM0}$, $T_{CM1}$, $T_{CM2}$, $T_{CM3}$, $T_{CM0}{}'$, $T_{CM1}{}'$, $T_{CM2}{}'$, and $T_{CM3}{}'$ are all coupled to the ground voltage GND, gate terminals of the operational transistors $T_{CM0}$, $T_{CM0}{}'$ are coupled to the threshold driver 442 to receive the driving signal DS[0], gate terminals of the operational transistors $T_{CM1}$, $T_{CM1}{}'$ are coupled to the threshold driver 442 to receive the driving signal DS[1], gate terminals of the operational transistors $T_{CM2}$, $T_{CM2}{}'$ are coupled to the threshold driver 442 to receive the driving signal DS[2], and gate terminals of the operational transistors $T_{CM3}$, $T_{CM3}{}'$ are coupled to the threshold driver 442 to receive the driving signal DS[3].

Operation of the memory cell 1000 in FIG. 10 may be deduced according to the operation of the memory cell 600 in FIG. 6, so that detail thereof is not repeated here. It should be noted that the embodiment takes the memory cell 1000 receiving an input data of 4 bits as an example, but those skilled in the art may appropriately adjust the number of bits of the input data and the number of transistors according to an actual application situation, which is not limited by the embodiment.

Figure 11:
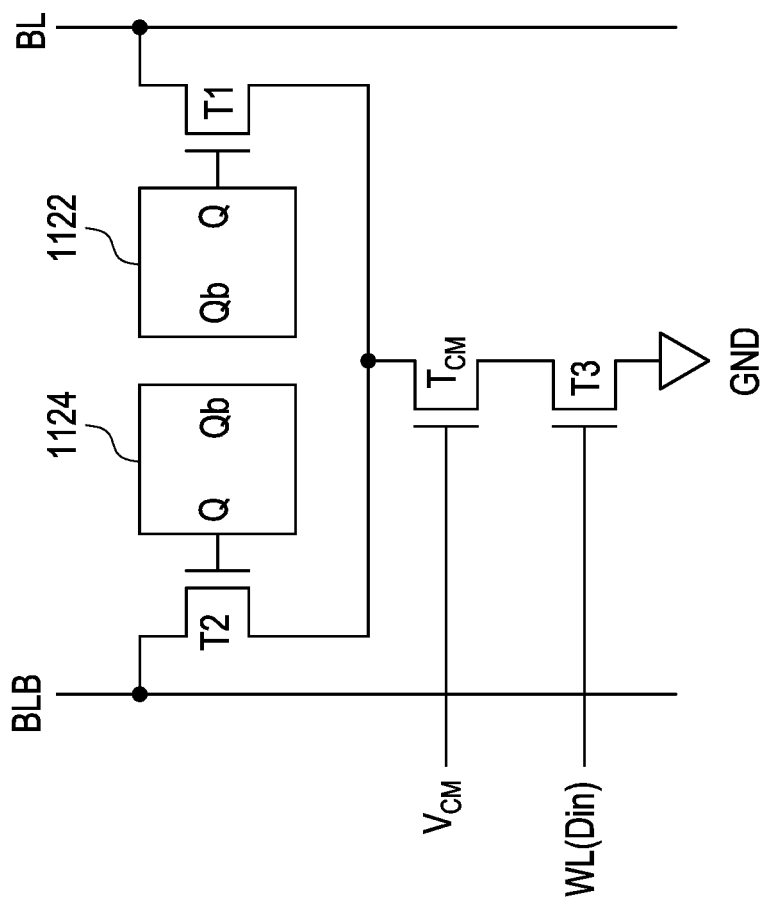
FIG. 11 is a circuit diagram of a memory cell according to a seventh embodiment of the disclosure.

FIG. 11 is a circuit diagram of a memory cell according to a seventh embodiment of the disclosure. Referring to FIG. 11, a memory cell 1100 of FIG. 11 may be implemented as the memory cell 100 of FIG. 1. The detailed circuit structures of various components (the weight storage circuit 120 and the driving circuit 140) in the memory cell 1000 are further described below.

However, it should be noted that the driving circuit 140 of FIG. 11 is the same as the driving circuit 140 of FIG. 2. Therefore, further description below is mainly for the difference (the weight storage circuit 120).

In the embodiment of the disclosure, the weight storage circuit 120 includes SRAM cells 1122 and 1124. The SRAM cells 1122 and 1124 respectively have the storage node Q and the storage node bar Qb, the storage node Q of the SRAM cell 1122 is coupled to the gate terminal of the transistor T1, and the storage node Q of the SRAM cell 1124 is coupled to the gate terminal of the transistor T2.

Operation of the memory cell 1100 is described in detail below. The SRAM cells 1122 and 1124 of the memory cell 1100 store weight values, and determine to turn on the transistor T1 or T2 according to an output value of the storage node Q. Namely, the SRAM cells 1122 and 1124 determine to connect the path of the bit line BL or the bit line bar BLB to the operational transistor $T_{CM}$. At this time, if the operational transistor $T_{CM}$ operates at the threshold voltage $V_{CM}$, and the input data Din received by the transistor T3 from the word line WL is 1, the operation current $I_{CM}$ will be generated on the path of the transistor T1 or T2 turned on by the SRAM cells 1122 and 1124; if the operational transistor $T_{CM}$ operates at the threshold voltage $V_{CM}$, and the input data Din received by the transistor T3 from the word line WL is 0, the operation current $I_{CM}$ cannot be generated on the path of the transistor T1 or T2 turned on by the SRAM cells 1122 and 1124. Finally, a sensing amplifier (not shown in the figure) compares the total operation current on the path of the bit line BL and the total operation current on the path of the bit line bar BLB to determine an output value.

In an embodiment, the sensing amplifier determines that the total operation current on the path of the bit line BL is greater than the total operation current on the path of the bit line bar BLB, which represents that the positive end current is larger, so that the sensing amplifier outputs 1; otherwise, the sensing amplifier determines that the total operation current on the path of the bit line BL is smaller than the total operation current on the path of the bit line bar BLB, which represents that the negative end current is larger, so that the sensing amplifier outputs 0.

Figure 12:
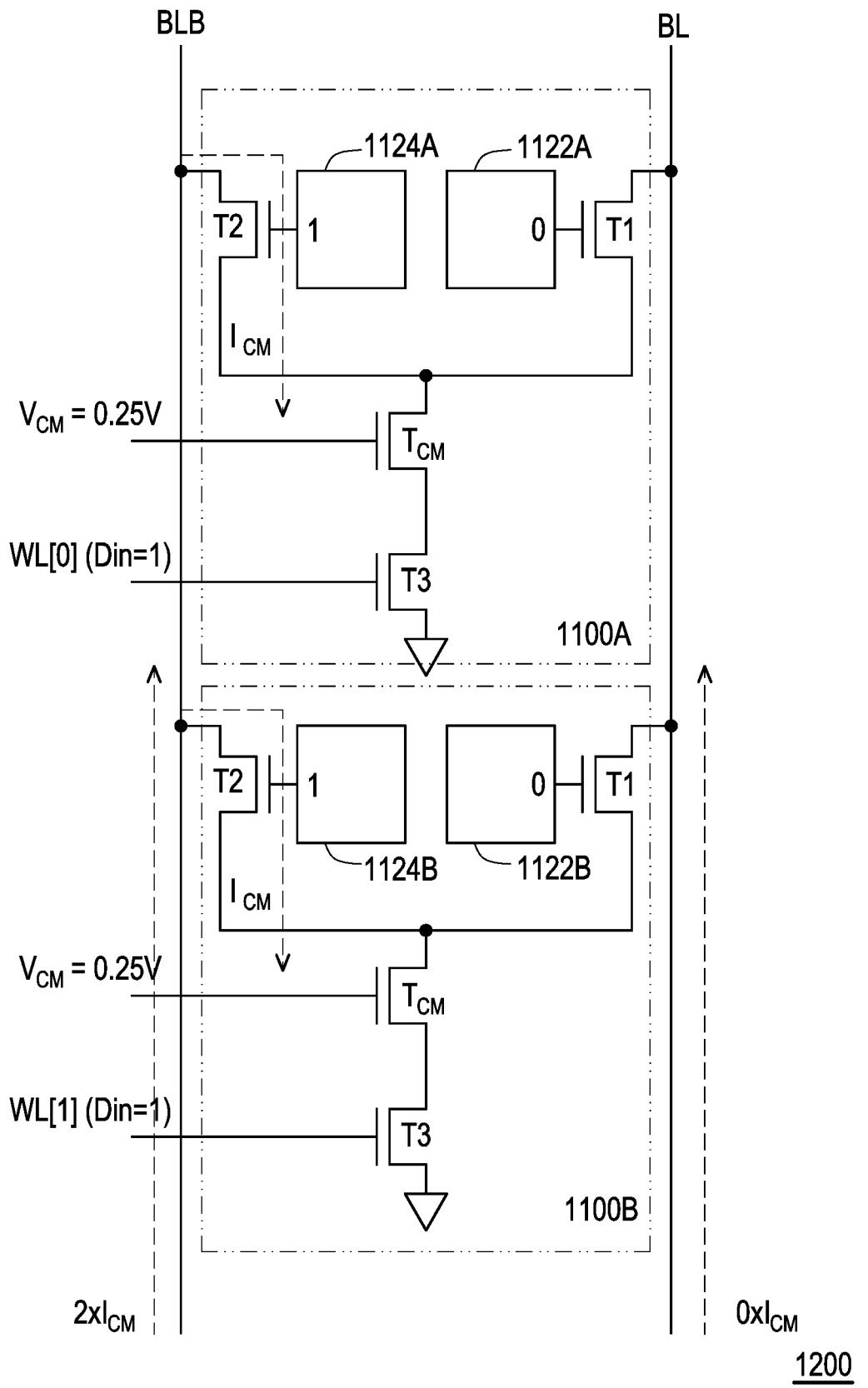
FIG. 12 is a circuit operation diagram of memory cells in a memory array according to the seventh embodiment of the disclosure.

FIG. 12 is a circuit operation diagram of memory cells in a memory array according to the seventh embodiment of the disclosure. Referring to FIG. 12, a memory array 1200 includes memory cells 1100A and 1100B, and the memory cells 1100A and 1100B are the same as the memory cell 1100 in FIG. 11. Circuit operations of the memory cells 1100A and 1100B in the memory array 1200 are described below.

It should be noted that in the memory array 1200 of FIG. 12 of the embodiment, two memory cells 1100A and 1100B are taken as an example for description, but those skilled in the art may appropriately adjust the number of memory cells according to an actual application situation, which is not limited by the embodiment.

In an embodiment, taking FIG. 12 as an example, SRAM cells 1124A and 1124B both turn on the transistor T2 to connect the path of the bit line bar BLB to the operational transistor $T_{CM}$, and the operational transistor $T_{CM}$ operates at the threshold voltage $V_{CM}$ of 0.25V. The input data Din received by the transistor T3 from the word lines WL[0] and WL[1] are all 1. Therefore, the operation current $I_{CM}$ will be generated on the path of the transistor T2 turned on by the SRAM cell 1124A and the SRAM cell 1124B.

Therefore, a total of 2 times of the operation current $I_{CM}$ is accumulated on the bit line bar BLB (i.e., the total operation current on the path of the bit line bar BLB=2× $I_{CM}$), and there is no operation current $I_{CM}$ accumulated on the bit line BL (i.e., the total operation current on the path of the bit line BL=0× $I_{CM}$). Finally, a sensing amplifier (not shown in the figure) determines that the total operation current on the path of the bit line bar BLB is greater than the total operation current on the path of the bit line BL, which represents that the negative end current is larger, so that the sensing amplifier outputs 0.

Figure 13:
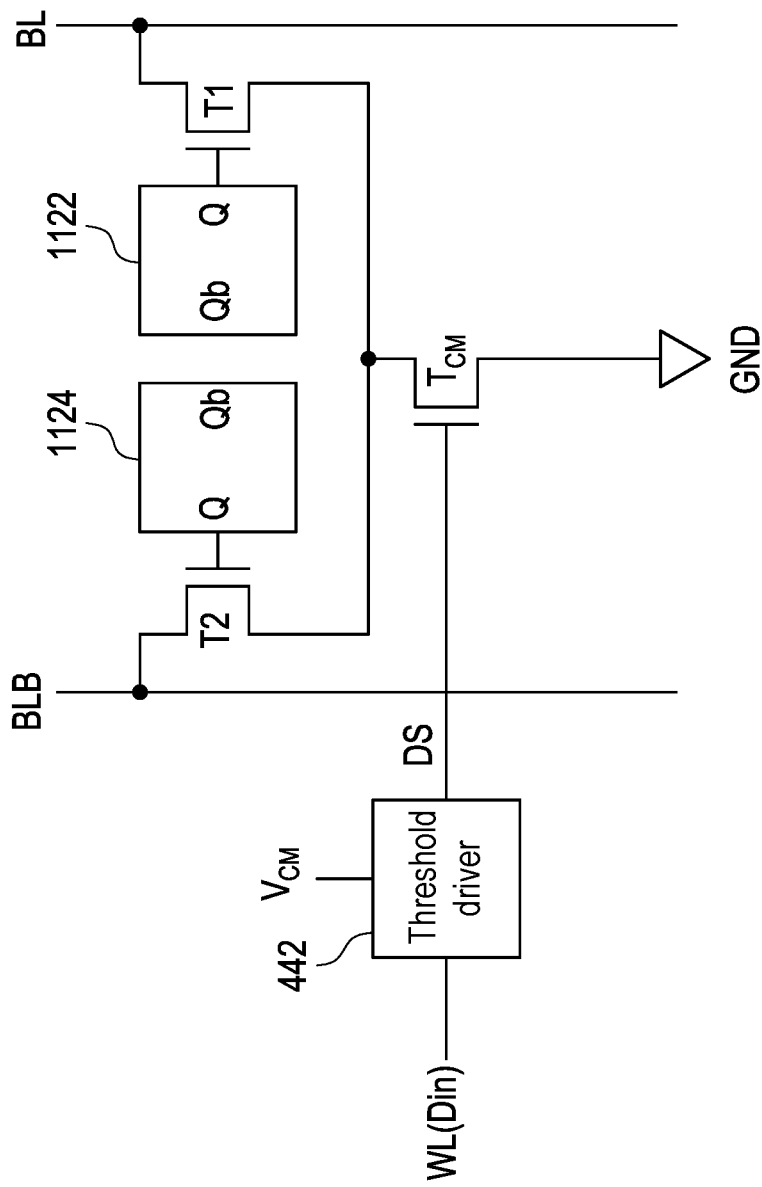
FIG. 13 is a circuit diagram of a memory cell according to an eighth embodiment of the disclosure.

FIG. 13 is a circuit diagram of a memory cell according to an eighth embodiment of the disclosure. Referring to FIG. 13, a memory cell 1300 of FIG. 13 may be implemented as the memory cell 100 of FIG. 1. It should be noted that the weight storage circuit 120 of FIG. 13 is the same as the weight storage circuit 120 of FIG. 11, and the driving circuit 140 of FIG. 13 is the same as the driving circuit 140 in FIG. 4. Operation of the memory cell 1300 of FIG. 13 may be deduced according to the operation of the memory cell 1100 of FIG. 11 and the memory cell 400 of FIG. 4, and detail thereof is not repeated.

Figure 14:
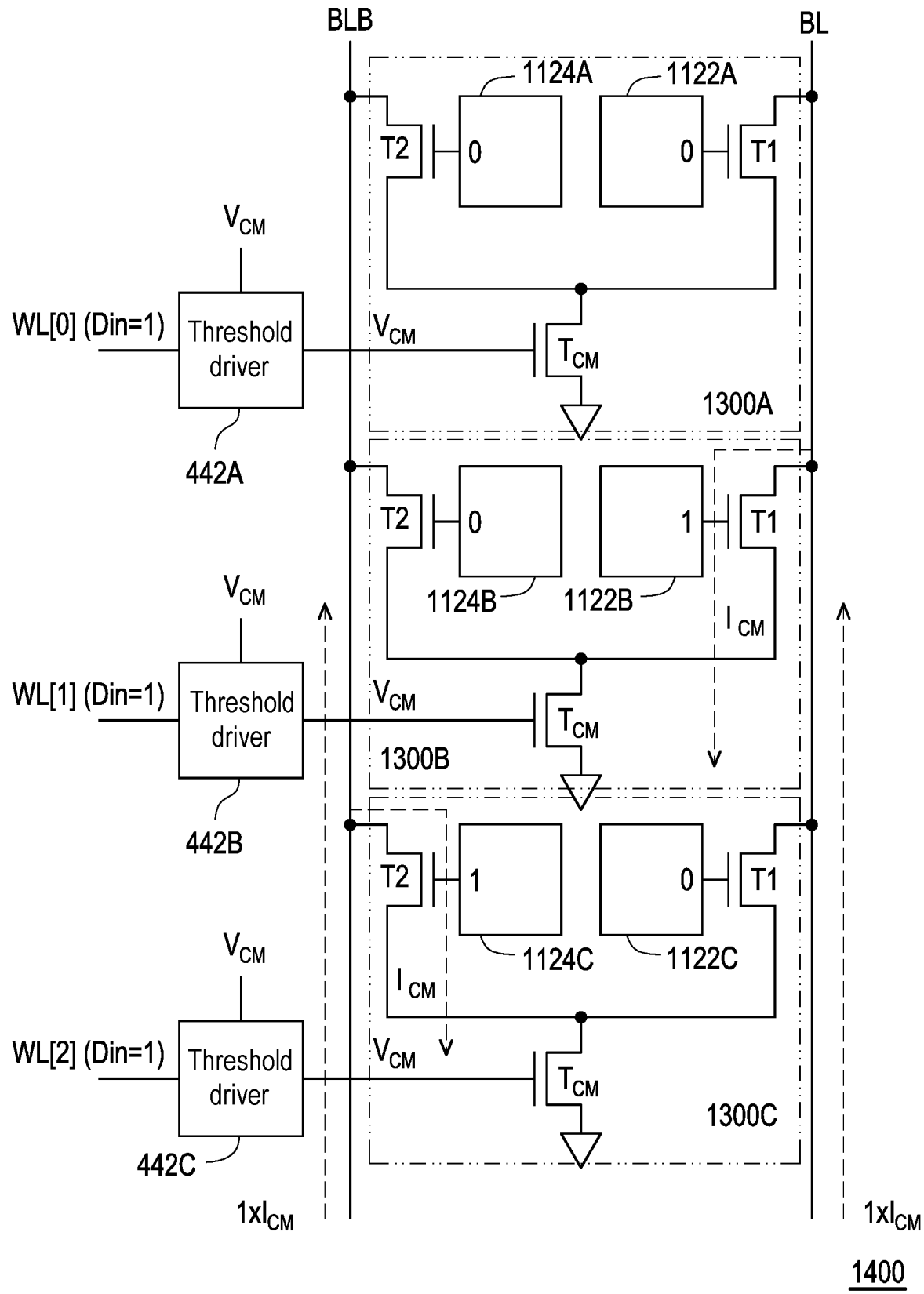
FIG. 14 is a circuit operation diagram of memory cells in a memory array according to the eighth embodiment of the disclosure.

FIG. 14 is a circuit operation diagram of memory cells in a memory array according to the eighth embodiment of the disclosure. Referring to FIG. 14, a memory array 1400 includes memory cells 1300A, 1300B and 1300C, and the memory cells 1300A, 1300B and 1300C are the same as the memory cell 1300 of FIG. 13. Circuit operations of the memory cells 1300A, 1300B and 1300C in the memory array 1400 are described below.

It should be noted that in the memory array 1400 of FIG. 14 of the embodiment, three memory cells 1300A, 1300B and 1300C are taken as an example for description, but those skilled in the art may appropriately adjust the number of memory cells according to an actual application situation, which is not limited by the embodiment.

In an embodiment, taking FIG. 14 as an example, a SRAM cell 1122A and the SRAM cell 124A respectively turn off the transistors T1 and T2, and a SRAM cell 1122B and the SRAM cell 1124B respectively turn on the transistor T1 and turn off the transistor T2 to connect the path of the bit line BL to the operational transistor $T_{CM}$ of the memory cell 1300B, and SRAM cells 1122C and 1124C respectively turn off the transistor T1 and turn on the transistor T2 to connect the path of the bit line bar BLB to the operational transistor $T_{CM}$ of the memory cell 1300C. The input data Din respectively received by the threshold drivers 442A, 442B and 442C from the word lines WL[0], WL[1] and WL[2] are all 1, so that the threshold drivers 442A, 442B and 442C all output the threshold voltage $V_{CM}$ (i.e., the driving signal DS is 1) to make the operational transistor $T_{CM}$ operating at the threshold voltage $V_{CM}$. Therefore, the operation current $I_{CM}$ will be generated on the path of the transistor T1 turned on by the SRAM cell 1122B and the path of the transistor T2 turned on by the SRAM cell 1124C.

Therefore, a total of 1 time of the operation current $I_{CM}$ is accumulated on the bit line bar BLB (i.e., the total operation current on the path of the bit line bar BLB=1× $I_{CM}$), and a total of 1 time of the operation current $I_{CM}$ is accumulated on the bit line BL (i.e., the total operation current on the path of the bit line BL=1× $I_{CM}$). Finally, a sensing amplifier (not shown in the figure) determines that the total operation current on the path of the bit line bar BLB is equal to the total operation current on the path of the bit line BL, which represents that the negative end current is the same as the positive end current, and the output value cannot be determined under such condition. In an embodiment, under such condition, a designed fixed output value of the sensing amplifier design is tended to be output, for example, the sensing amplifier may have a fixed output of 0.

Figure 15:
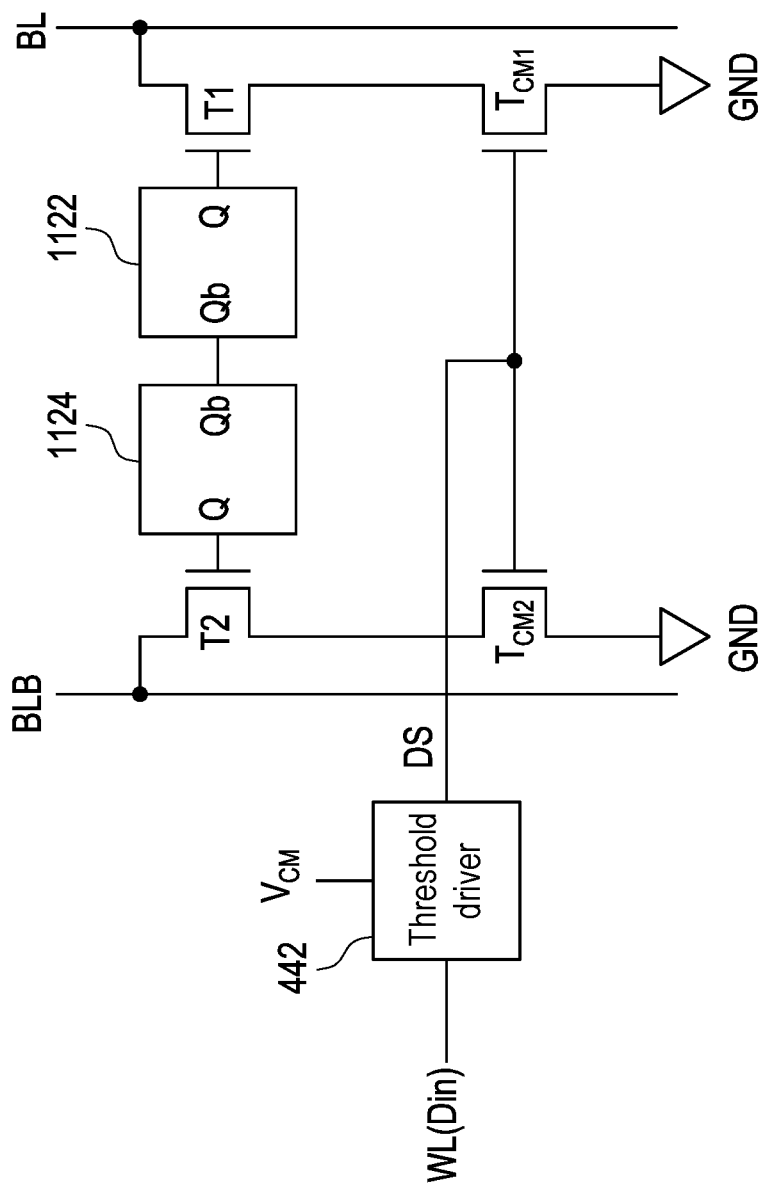
FIG. 15 is a circuit diagram of a memory cell according to a ninth embodiment of the disclosure.

FIG. 15 is a circuit diagram of a memory cell according to a ninth embodiment of the disclosure. Referring to FIG. 15, a memory cell 1500 of FIG. 15 may be implemented as the memory cell 100 of FIG. 1. It should be noted that the weight storage circuit 120 of FIG. 15 is the same as the weight storage circuit 120 of FIG. 11, and the driving circuit 140 of FIG. 15 is the same as the driving circuit 140 in FIG. 6. Operation of the memory cell 1500 of FIG. 15 may be deduced according to the operation of the memory cell 1100 of FIG. 11 and the memory cell 600 of FIG. 6, and detail thereof is not repeated.

Figure 16:
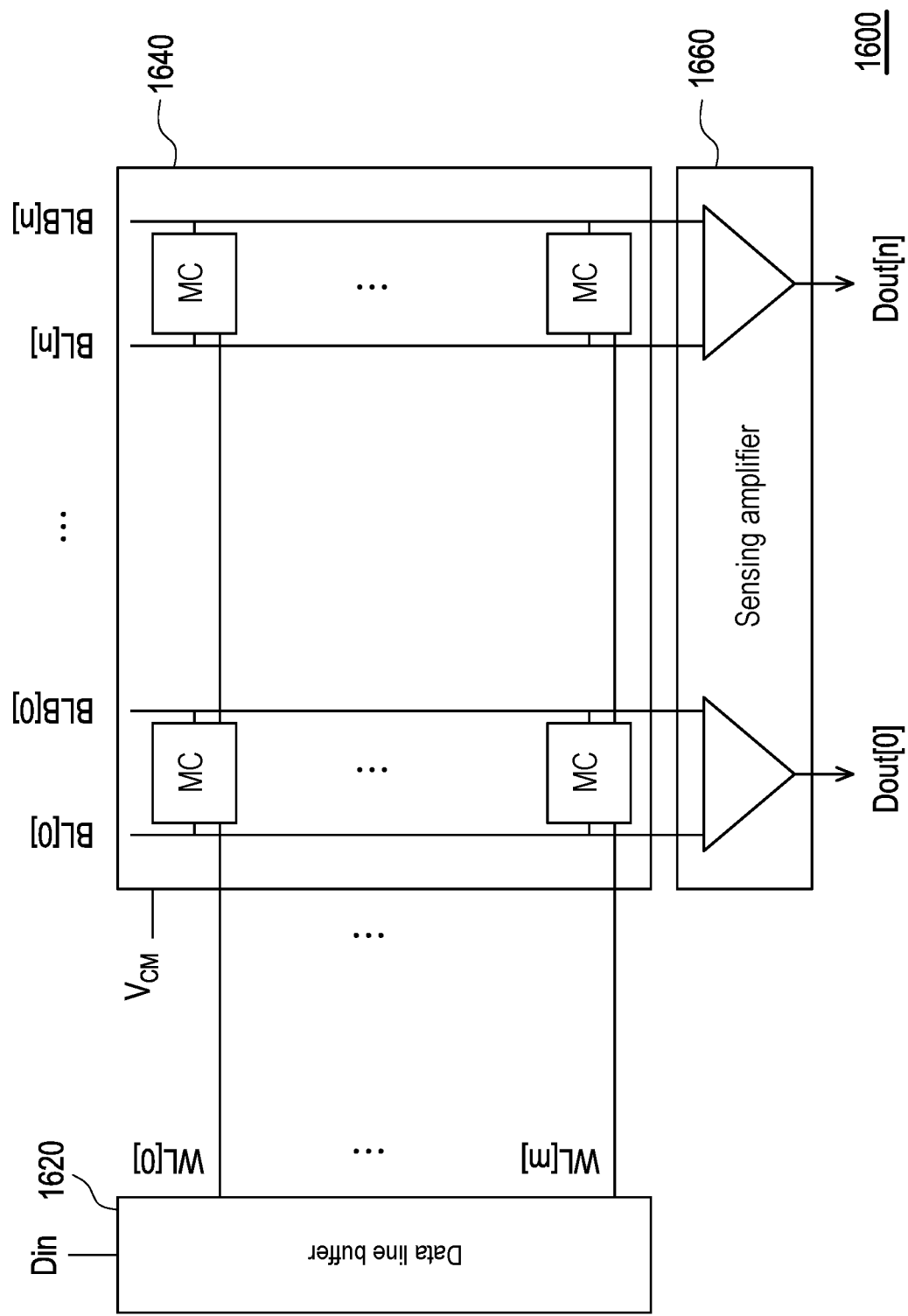
FIG. 16 is a block diagram of a memory system according to the first embodiment of the disclosure.

FIG. 16 is a block diagram of a memory system according to the first embodiment of the disclosure. Referring to FIG. 16, a memory system 1600 includes a data line buffer 1620, a memory array 1640 and a sensing amplifier 1660. The memory array 1640 is coupled between the data line buffer 1620 and the sensing amplifier 1660, and includes a plurality of memory cells MC. In the embodiment of the disclosure, the memory cell MC is, for example, one of the memory cell 200 of FIG. 2, the memory cell 800 of FIG. 8, and the memory cell 1100 of FIG. 11, but the disclosure is not limited thereto.

Figure 17:
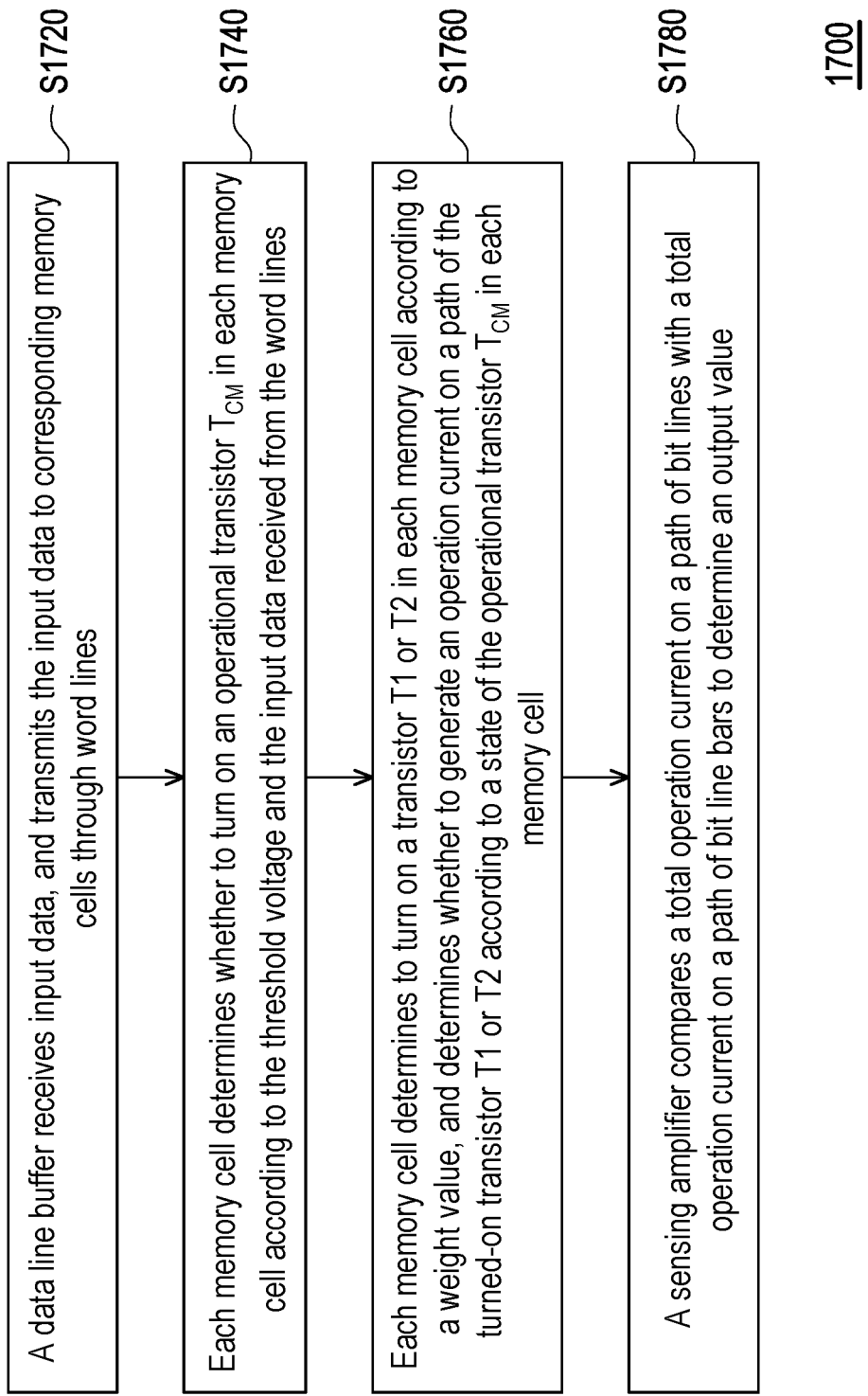
FIG. 17 is a flowchart of an operation method of the memory system according to the first embodiment of the disclosure.

FIG. 17 is a flowchart of an operation method of the memory system according to the first embodiment of the disclosure. Referring to FIG. 16 and FIG. 17 at the same time, an operation method 1700 of the embodiment is applicable to the memory system 1600 of FIG. 16, and detailed steps of the operation method of the memory system of embodiments of the disclosure are described below with reference of operational relationship between various devices in the memory system 1600.

In step S1720, the data line buffer 1620 receives the input data Din, and transmits the input data Din to the corresponding memory cells MC through the word lines WL[0] to WL[m].

In step S1740, each memory cell MC determines whether to turn on the operational transistor $T_{CM}$ in each memory cell MC according to the threshold voltage $V_{CM}$ and the input data Din received from the word lines WL[0] to WL[m]. Specifically, each memory cell MC determines the operational transistor $T_{CM}$ in each memory cell MC to be turned on to a subthreshold region or completely turned off according to the threshold voltage $V_{CM}$ and the input data Din.

In step S1760, each memory cell MC determines to turn on the transistor T1 or T2 in each memory cell MC according to a weight value, and determines whether to generate an operation current on the path of the turned-on transistor T1 or T2 according to a state of the operational transistor $T_{CM}$ in each memory cell MC.

In step S1780, the sensing amplifier 1660 compares a total operation current on the path of bit lines BL[0] to BL[n] with a total operation current on the path of bit line bars BLB[0] to BLB[n] to determine output values Dout[0] to Dout[n].

Figure 18:
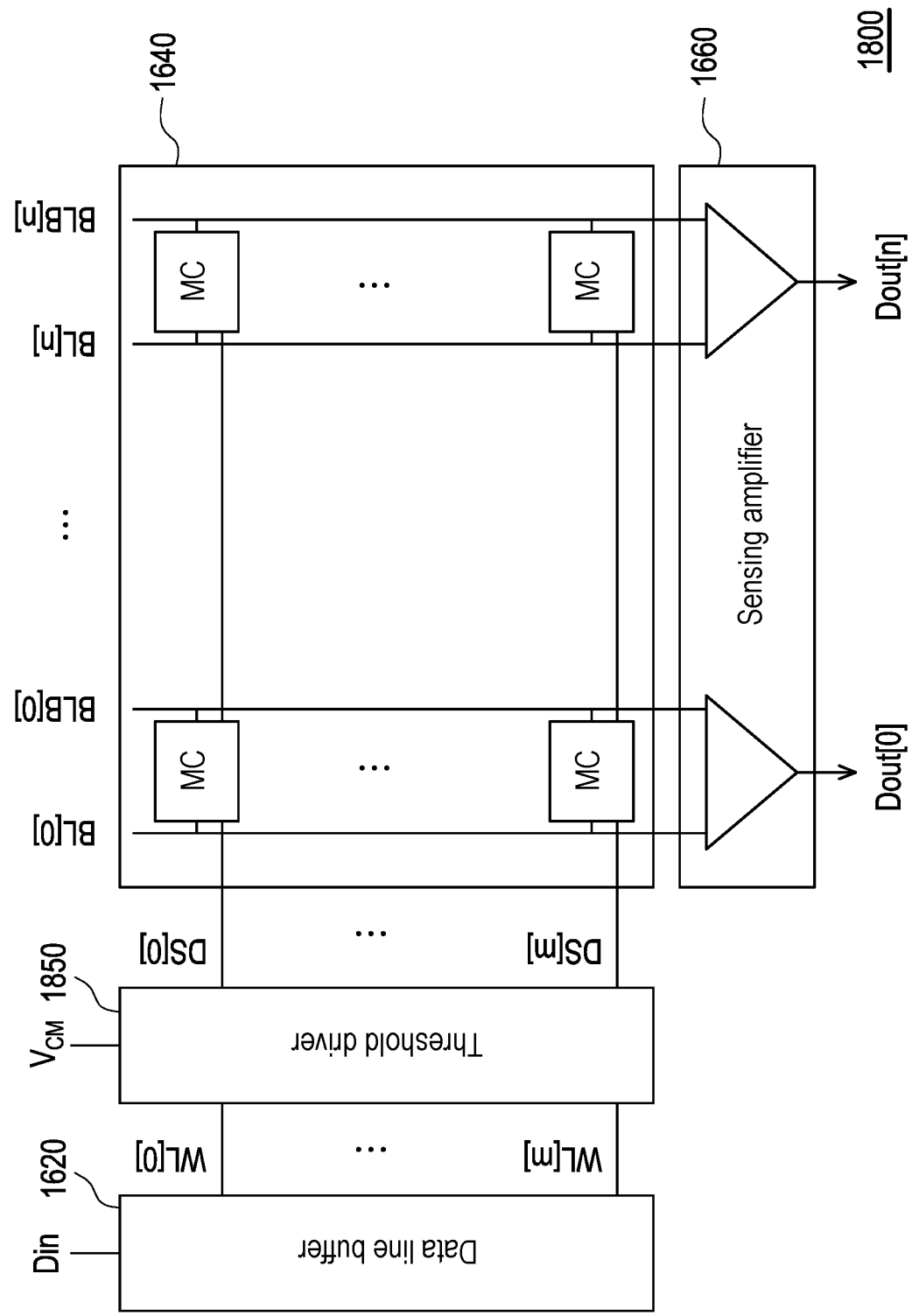
FIG. 18 is a block diagram of a memory system according to the second embodiment of the disclosure.

FIG. 18 is a block diagram of a memory system according to the second embodiment of the disclosure. Referring to FIG. 18, a memory system 1800 is similar to the memory system 1600 of FIG. 16, and a difference there between is that the memory system 1800 further includes a threshold driver 1850. The threshold driver 1850 is coupled between the data line buffer 1620 and the memory array 1640, and receives the threshold voltage $V_{CM}$. In the embodiment of the disclosure, the memory cell MC is, for example, one of the memory cell 400 of FIG. 4, the memory cell 600 of FIG. 6, the memory cell 900 of FIG. 9, the memory cell 1000 of FIG. 10, the memory cell 1300 of FIG. 13, and the memory cell 1500 of FIG. 15, which is not limited by the disclosure.

Figure 19:
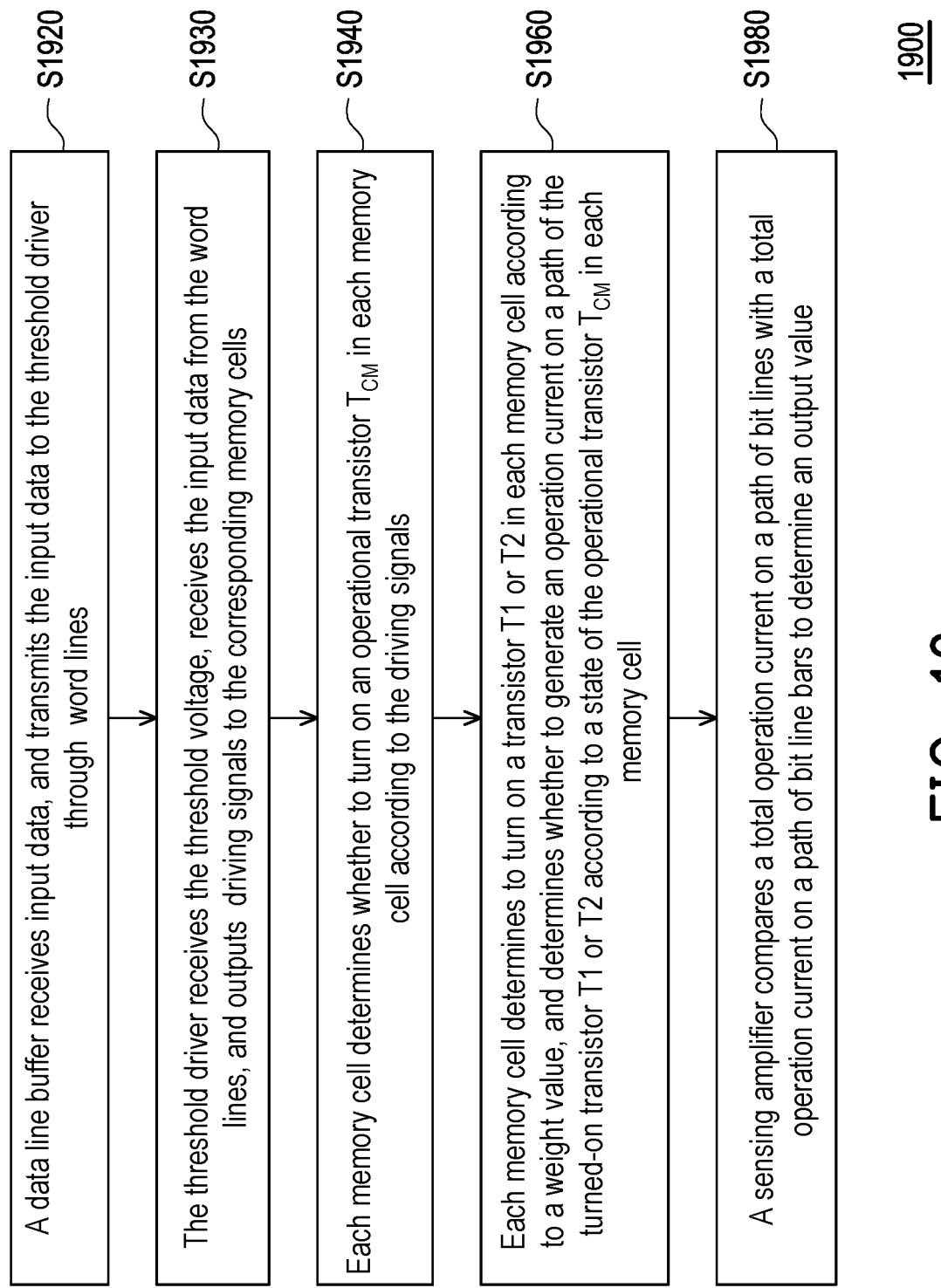
FIG. 19 is a flowchart of an operation method of a memory system according to the second embodiment of the disclosure.

FIG. 19 is a flowchart of an operation method of the memory system according to the second embodiment of the disclosure. Referring to FIG. 18 and FIG. 19 at the same time, an operation method 1900 of the embodiment is applicable to the memory system 1800 of FIG. 18, and detailed steps of the operation method of the memory system of the embodiments of the disclosure are described below with reference of operational relationship between various devices in the memory system 1800.

In step S1920, the data line buffer 1620 receives the input data Din, and transmits the input data Din to the threshold driver 1850 through the word lines WL[0] to WL[m].

In step S1930, the threshold driver 1850 receives the threshold voltage $V_{CM}$, receives the input data Din from the word lines WL[0] to WL[m], and outputs the driving signals DS[0] to DS[m] to the corresponding memory cells MC.

In step S1940, each memory cell MC determines whether to turn on the operational transistor $T_{CM}$ in each memory cell MC according to the driving signals DS[0] to DS[m]. Specifically, each memory cell MC determines the operational transistor $T_{CM}$ in each memory cell MC to be turned on to the subthreshold region or completely turned off according to the driving signals DS[0] to DS[m].

In step S1960, each memory cell MC determines to turn on the transistor T1 or T2 in each memory cell MC according to a weight value, and determines whether to generate an operation current on the path of the turned-on transistor T1 or T2 according to a state of the operational transistor $T_{CM}$ in each memory cell MC.

In step S1980, the sensing amplifier 1660 compares a total operation current on the path of the bit lines BL[0] to BL[n] with a total operation current on the path of the bit line bars BLB[0] to BLB[n] to determine the output values Dout[0] to Dout[n].

In summary, the memory cell of the embodiments of the disclosure uses a new transistor framework to achieve an effect that a single SRAM cell may support complementary CIM computations, thereby reducing the number of transistors. In addition, the memory cell is further combined with a subthreshold operating transistor to achieve high parallel computation. In this way, chip area cost and leakage current of the memory cell may be reduced, and computing performance is improved.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory cell, comprising:
   a first transistor, having a first terminal coupled to a bit line;
   a second transistor, having a first terminal coupled to a bit line bar;
   a weight storage circuit, coupled between a gate terminal of the first transistor and a gate terminal of the second transistor, and configured to store a weight value; and a driving circuit, coupled to a second terminal of the first transistor, a second terminal of the second transistor, and at least one word line, and configured to receive at least one threshold voltage and receive at least one input data from the word line, wherein the weight storage circuit determines to turn on the first transistor or the second transistor according to output values of a storage node and a storage node bar of the weight storage circuit, the driving circuit determines whether to generate an operation current on a path of the turned-on first transistor or the turned-on second transistor according to the threshold voltage and the input data.

2. The memory cell according to claim 1, wherein the weight storage circuit comprises:
a static random access memory cell, having a storage node coupled to the gate terminal of the first transistor, and a storage node bar coupled to the gate terminal of the second transistor.

3. The memory cell according to claim 2, wherein the driving circuit comprises:
a third transistor, having a first terminal coupled to the second terminal of the first transistor and the second terminal of the second transistor, and a gate terminal coupled to the threshold voltage; and
a fourth transistor, having a first terminal coupled to the second terminal of the third transistor, a second terminal coupled to a ground voltage, and a gate terminal coupled to the word line to receive the input data.

4. The memory cell according to claim 2, wherein the driving circuit comprises:
a threshold driver, coupled to the word line, configured to receive the threshold voltage and the input data, and generating a driving signal; and
a third transistor, having a first terminal coupled to the second terminal of the first transistor and the second terminal of the second transistor, a second terminal coupled to a ground voltage, and a gate terminal coupled to the threshold driver to receive the driving signal.

5. The memory cell according to claim 4, wherein the threshold driver comprises:
a transmission gate, having an input terminal coupled to the threshold voltage, wherein the transmission gate is turned on or off according to the input data; and
a fourth transistor, having a first terminal coupled to an output terminal of the transmission gate, a second terminal coupled to the ground voltage, and a gate terminal coupled to a word line bar to receive an inverted input data.

6. The memory cell according to claim 2, wherein the driving circuit comprises:
a threshold driver, coupled to the word line, configured to receive the threshold voltage and the input data, and generating a driving signal;
a third transistor, having a first terminal coupled to the second terminal of the first transistor, a second terminal coupled to a ground voltage, and a gate terminal coupled to the threshold driver to receive the driving signal; and
a fourth transistor, having a first terminal coupled to the second terminal of the second transistor, a second terminal coupled to the ground voltage, and a gate terminal coupled to the threshold driver to receive the driving signal.

7. The memory cell according to claim 2, wherein the driving circuit comprises:

a plurality of third transistors, each having a first terminal coupled to the second terminal of the first transistor and the second terminal of the second transistor, and a gate terminal coupled to the corresponding threshold voltage; and
a plurality of fourth transistors, each having a first terminal coupled to a second terminal of the corresponding third transistor, a second terminal coupled to a ground voltage, and a gate terminal coupled to the corresponding word line to receive the corresponding input data.

8. The memory cell according to claim 2, wherein the driving circuit comprises:
a threshold driver, coupled to the word line, configured to receive the threshold voltage and the input data, and generating at least one driving signal; and
a plurality of third transistors, each having a first terminal coupled to the second terminal of the first transistor and the second terminal of the second transistor, a second terminal coupled to a ground voltage, and a gate terminal coupled to the threshold driver to receive the corresponding driving signal.

9. The memory cell according to claim 2, wherein the driving circuit comprises:
a threshold driver, coupled to the word line, configured to receive the threshold voltage and the input data, and generating at least one driving signal;
a plurality of third transistors, each having a first terminal coupled to the second terminal of the first transistor, a second terminal coupled to a ground voltage, and a gate terminal coupled to the threshold driver to receive the corresponding driving signal; and
a plurality of fourth transistors, each having a first terminal coupled to the second terminal of the second transistor, a second terminal coupled to the ground voltage, and a gate terminal coupled to the threshold driver to receive the corresponding driving signal.

10. The memory cell according to claim 2, wherein the static random access memory cell is a 6T static random access memory cell.

11. The memory cell according to claim 1, wherein the weight storage circuit comprises:
a first static random access memory cell, having a storage node coupled to the gate terminal of the first transistor; and
a second static random access memory cell, having a storage node coupled to the gate terminal of the second transistor.

12. The memory cell according to claim 11, wherein the driving circuit comprises:
a third transistor, having a first terminal coupled to the second terminal of the first transistor and the second terminal of the second transistor, and a gate terminal coupled to the threshold voltage; and
a fourth transistor, having a first terminal coupled to the second terminal of the third transistor, a second terminal coupled to a ground voltage, and a gate terminal coupled to the word line to receive the input data.

13. The memory cell according to claim 11, wherein the driving circuit comprises:
a threshold driver, coupled to the word line, configured to receive the threshold voltage and the input data, and generating a driving signal; and
a third transistor, having a first terminal coupled to the second terminal of the first transistor and the second terminal of the second transistor, a second terminal coupled to a ground voltage, and a gate terminal coupled to the threshold driver to receive the driving signal.

14. The memory cell according to claim 13, wherein the threshold driver comprises:

a transmission gate, having an input terminal coupled to the threshold voltage, wherein the transmission gate is turned on or off according to the input data; and a fourth transistor, having a first terminal coupled to an output terminal of the transmission gate, a second terminal coupled to the ground voltage, and a gate terminal coupled to a word line bar to receive an inverted input data.

15. The memory cell according to claim 11, wherein the driving circuit comprises:

a threshold driver, coupled to the word line, configured to receive the threshold voltage and the input data, and generating a driving signal;

a third transistor, having a first terminal coupled to the second terminal of the first transistor, a second terminal coupled to a ground voltage, and a gate terminal coupled to the threshold driver to receive the driving signal; and a fourth transistor, having a first terminal coupled to the second terminal of the second transistor, a second terminal coupled to the ground voltage, and a gate terminal coupled to the threshold driver to receive the driving signal.

16. The memory cell according to claim 11, wherein the first static random access memory cell and the second static random access memory cell are each a 6T static random access memory cell.

17. The memory cell according to claim 1, wherein the first transistor and the second transistor are each an N-type metal oxide semiconductor transistor.

18. The memory cell according to claim 1, wherein the weight value is a single complementary weight.

19. The memory cell according to claim 1, wherein the weight value is a ternary weight.

20. The memory cell according to claim 1, wherein the memory cell is comprised in a memory system.

* * * * *